(12) United States Patent
Rhie

(10) Patent No.: US 11,664,463 B2
(45) Date of Patent: May 30, 2023

(54) NAND FLASH MEMORY WITH VERTICAL CELL STACK STRUCTURE AND METHOD FOR MANUFACTURING SAME

(71) Applicant: Mosaid Technologies Incorporated, Ottawa (CA)

(72) Inventor: Hyoung Seub Rhie, Ottawa (CA)

(73) Assignee: Mosaid Technologies Incorporated, Ottawa (CA)

( * ) Notice: Subject to any disclaimer, the term of this patent is extended or adjusted under 35 U.S.C. 154(b) by 142 days.

(21) Appl. No.: 17/369,007

(22) Filed: Jul. 7, 2021

(65) Prior Publication Data
US 2021/0408301 A1    Dec. 30, 2021

Related U.S. Application Data

(63) Continuation of application No. 16/816,520, filed on Mar. 12, 2020, now Pat. No. 11,088,289, which is a continuation of application No. 16/521,066, filed on Jul. 24, 2019, now Pat. No. 10,622,488, which is a continuation of application No. 13/803,085, filed on Mar. 14, 2013, now Pat. No. 10,403,766.

(60) Provisional application No. 61/733,063, filed on Dec. 4, 2012.

(51) Int. Cl.
| | | |
|---|---|---|
| H01L 29/792 | (2006.01) | |
| H01L 29/66 | (2006.01) | |
| G11C 16/04 | (2006.01) | |
| G11C 11/56 | (2006.01) | |

(52) U.S. Cl.
CPC ...... *H01L 29/7926* (2013.01); *G11C 11/5621* (2013.01); *G11C 16/0483* (2013.01); *H01L 29/66833* (2013.01); *H10B 43/27* (2023.02); *H10B 43/40* (2023.02); *G11C 2213/71* (2013.01)

(58) Field of Classification Search
CPC .................................................. H01L 29/792
See application file for complete search history.

(56) References Cited

U.S. PATENT DOCUMENTS

| | | |
|---|---|---|
| 5,473,563 A | 12/1995 | Suh et al. |
| 6,560,162 B2 | 5/2003 | Kwon |
| 7,161,837 B2 | 1/2007 | Park |

(Continued)

FOREIGN PATENT DOCUMENTS

WO    2011137257    11/2011

OTHER PUBLICATIONS

Suh, K. et al., A 3.3 V 32 MB NAND Flash Memory With Incremental Step Pulse Programming Scheme, IEEE Journal of Solid-State Circuits, vol. 30, No. 11, Nov. 1995, pp. 1149-1156.

(Continued)

*Primary Examiner* — Marvin Payen
(74) *Attorney, Agent, or Firm* — Conversant IP Management Corp.

(57) ABSTRACT

Disclosed is a method of manufacturing flash memory with a vertical cell stack structure. The method includes forming source lines in a cell area of a substrate having an ion-implanted well and forming an alignment mark relative to the source lines. The alignment mark is formed in the substrate outside the cell area of the substrate. After formation of the source lines, cell stacking layers are formed. After forming the cell stacking layers, cell pillars in the cell stacking layers are formed at locations relative to the previously formed source lines using the alignment mark to correctly locate the cell pillars.

7 Claims, 37 Drawing Sheets

(56) References Cited

U.S. PATENT DOCUMENTS

| | | |
|---|---|---|
| 7,440,326 B2 | 10/2008 | Ito |
| 7,525,841 B2 | 4/2009 | Aritome |
| 7,551,492 B2 | 6/2009 | Kim |
| 7,813,169 B2 | 10/2010 | Kux et al. |
| 7,813,184 B2 | 10/2010 | Kim et al. |
| 7,852,676 B2 | 12/2010 | Maejima |
| 7,885,115 B2 | 2/2011 | Lee et al. |
| 7,940,578 B2 | 5/2011 | Kang et al. |
| 7,944,752 B2 | 5/2011 | Lee |
| 7,952,943 B2 | 5/2011 | Cho |
| 7,978,518 B2 | 7/2011 | Pyeon et al. |
| 7,994,011 B2 | 8/2011 | Park et al. |
| 8,045,386 B2 | 10/2011 | Santin et al. |
| 8,085,616 B2 | 12/2011 | Ryu |
| 8,189,390 B2 | 5/2012 | Kim |
| 8,189,391 B2 | 5/2012 | Itagaki et al. |
| 8,199,573 B2 | 6/2012 | Fukuzumi et al. |
| 8,203,211 B2 | 6/2012 | Jeong et al. |
| 8,203,882 B2 | 6/2012 | Hishida et al. |
| 8,259,503 B2 | 9/2012 | Park et al. |
| 8,264,031 B2 | 9/2012 | Kidoh et al. |
| 8,278,170 B2 | 10/2012 | Lee et al. |
| 8,278,695 B2 | 10/2012 | Kidoh et al. |
| 10,403,766 B2 | 9/2019 | Rhie |
| 10,622,488 B2 | 4/2020 | Rhie |
| 2004/0179391 A1 | 9/2004 | Bhattacharyya |
| 2005/0099839 A1 | 5/2005 | Bhattacharyya |
| 2006/0083062 A1 | 4/2006 | Park et al. |
| 2008/0310216 A1 | 12/2008 | Miura |
| 2010/0078701 A1 | 4/2010 | Shim et al. |
| 2010/0120214 A1 | 5/2010 | Park et al. |
| 2011/0170352 A1 | 7/2011 | Kim et al. |
| 2012/0051137 A1 | 3/2012 | Hung et al. |
| 2012/0098051 A1 | 4/2012 | Son et al. |
| 2012/0181699 A1 | 7/2012 | Chen et al. |
| 2012/0182802 A1 | 7/2012 | Hung et al. |
| 2012/0182806 A1 | 7/2012 | Chen et al. |
| 2012/0223380 A1 | 9/2012 | Lee et al. |
| 2020/0381566 A1 | 12/2020 | Rhie |

OTHER PUBLICATIONS

Tanaka, et al., "Bit Cost Scalable Technology with Punch and Plug Process for Ultra High Density Flash Memory", Center for Semiconductor Research and Development and Process and Manufacturing Engineering Center, Toshiba Corporation, Semiconductor Company, 2007 Symposium on VLSI Technology Digest of Technical Papers, Jun. 2007, pp. 14-15.

Yoohyun Noh et al, "A New Metal Control Gate Last Process (MCGL Process) for High Performance DC-SF (Dual Control Gate With Surrounding Floating Gate) 3D NAND Flash Memory", 2012 Symposium on VLSI Technology Digest of Technical Papers; Jun. 2012, pp. 1-2.

Fukuzumi, et al., "Optimal Integration and Characteristics of Vertical Array Devices for Ultra-High Density, Bit-Cost Scalable Flash Memory", Center for Semiconductor Research and Development, Toshiba Corporation, Semiconductor Company, Toshiba Information Systems (Japan) Corporation, Dec. 2007, pp. 449-452.

Akihiro Nitayama et al, "Bit Cost Scalable (BiCS) Flash Technology for Future Ultra High Density Storage Devices", VLSI Technology Systems and Applications (VLSI TSA), 2010 international Symposium, Apr. 2010, pp. 130-131.

Megumi Ishiduki et al., "Optimal Device Structure for Pipe-shaped BiCS Flash Memory for Ultra High Density Storage Device with Excellent Performance and Reliability", Electron Devices Meeting (IEDM), 2009 IEEE International, Dec. 2009, pp. 27.3.1-27.3.4.

Jang, et al., "Vertical Cell Array using TCAT (Terabit Cell Array Transistor) Technology for Ultra High Density NAND Flash Memory" Advanced Technology Development Team 2 and Process Development Team, Memory R and D Center, Memory Division, Samsung Electronics Co. Ltd., 2009 Symposium on VLSI Technology Digest of Technical Papers, Jun. 2009, pp. 192-193.

Ryota Katsumata et al., "Pipe-shaped BiCS Flash Memory with 16 Stacked Layers and Multi-Level-Cell Operation for Ultra High Density Storage Devices", VLSI Technology Symposium, Jun. 2009, pp. 136-137.

Ki-Tae Park et al, "A 45nm 4Gb 3-Dimensional Double-Stacked Multi-Level NAND Flash Memory with Shared Bitline Structure", Solid-State Circuits Conference, ISSCC 2008 Digest of Technical Papers,, pp. 510-511 and 632, Feb. 6, 2008.

Jin-Ki Kim et al, "A 120mm2 64Mb NAND Flash Memory Achieving 180nsIByte Effective Program Speed", 1996 Symposium on VLSI Circuits Digest of Technical Papers, Jun. 1996, pp. 168-169.

Lee, June et al, High-Performance 1-GB Nand Flash Memory With .012-um Technology, IEEE Journal of Solid-State Circuits, vol. 37, No. 11, Nov. 2002, pp. 1502-1509.

Ki-Tae Park et al, "A Novel NAND Flash Memory With Asymmetric S/D Structure Using Fringe-Field-Induced Inversion Layer", IEEE Transactions on Electron Devices, vol. 55, Issue 1;, pp. 404-410, Jan. 1, 2008.

Lue, et al., "A Novel Junction-Free BE-SONOS NAND Flash"; Emerging Central Lab, Technology Development Center, Macronix International Co., Ltd.; 2008 Symposium on VLSI Technology Digest of Technical Papers; IEEE; Jan. 2008, pp. 140-141.

Chang-Hyoun Lee et al., "Highly Scalable NAND Flash Memory with Robust Immunity to Program Disturbance Using Symmetric Inversion-Type Source and Drain Structure", 2008 Symposium on VLSI Technology Digest of Technical Papers; Jun. 2008, pp. 118-119.

Lue, et al., "A Highly Scalable 8-Layer 3D Vertical-Gate (VG) TFT NAND Flash Using Junction-Free Buried Channel BE-SONOS Device", Emerging Central Lab, Technology Development Center, Macronix International Co., Ltd., 2010 Symposium on VLSI Technology Digest of Technical Papers, Jun. 2010, pp. 131-132.

Chang, et al., "Memory Architecture of 3D Vertical Gate (3DVG) Nand Flash Using Plural Island-Gate SSL Decoding Method and Study of It's Program Inhibit Characteristics", Macronix international Co., Ltd., Emerging Central Lab, Technology Development Center, Design Center, IEEE, May 2012, pp. 1-4.

Dongyean Oh et al, "A New Self-Boosting Phenomenon by Soure/Drain Depletion Cut-off in NAND Flash Memory", 2007 IEEE Non-Volatile Semiconductor Memory Workshop, Aug. 2007, pp. 1-3.

Il Han Park et al., "Depletion-Enhanced Body-Isolation (DEBI) Array on SOI for Highly Scalable and Reliable NAND Flash Memories", IEEE Transactions on Nanotechnology, vol. 5, No. 3, May 2006, pp. 201-204.

Jung, T. et al., A 117-MM2 3.3-V Only 128-MB Multilevel NAND Flash Memory for Mass Storage Applications, IEEE Journal of Solid-State Circuits, vol. 31, No. 11, Nov. 1996, pp. 1575-1583.

Hubert, et al., "A Stacked SONOS Technology, up to 4 Levels and 6nm Crystalline Nanowires, with Gate-all-around or Independent Gates (-Flash), Suitable for Full 3D integration", CEA-LETI, Minatec, STMicroelectronics, IEEE, Dec. 2009, pp. 1-4.

Chen, et al., "A Highly Pitch Scalable 3D Vertical Gate (VG) NAND Flash Decoded by a Novel Self-Aligned Independently Controlled Double Gate (IDG) String Select Transistor (SSL)", Emerging Central Lab, Technology Development Center, Macronix International Co., Ltd., 2012 Symposium on VLSI Technology Digest of Technical Papers, Jun. 2012, pp. 91-92.

Chen, et al., "A Highly Scalable 8-layer Vertical Gate 3D NAND with Split-page Bit Line Layout and Efficient Binary-sum MILC (Minimal incremental Layer Cost) Staircase Contacts", Macronix International Co., Ltd., IEEE, Dec. 2012, pp. 1-4.

Hung, et al., "Design innovations to Optimize the 3D Stackable Vertical Gate (VG) NAND Flash", Macronix International Co., Ltd., IEEE, Dec. 2012, pp. 1-4.

Hyun-Jin Cho et al, "Modeling of Surrounding Gate MOSFETs With Bulk Trap States", IEEE Transactions on Electron Devices, vol. 54, No. 1, Jan. 2007, pp. 166-169.

Andrew Walker, "Sub-50-nm Dual-Gate Thin-Film Transistors for Monolithic 3-D Flash",IEEE Transactions on Electron Devices, vol. 56, No. 11, Nov. 2009 , pp. 2703-2710.

(56) References Cited

OTHER PUBLICATIONS

Meikei Ieong et al, "DC and AC Performance Analysis of 25 nm Symmetric/Asymmetric Double-Gate, Back-Gate and Bulk CMOS", 2000 Simulation of Semiconductor Processes and Devices, Sep. 2000, pp. 147-150.

Hiroshi Nakamura et al., "A Novel Sense Amplifier for Flexible Voltage Operation NAND Flash Memories", 1995 Symposium on VLSI Circuits Digest of Technical Papers, Jun. 1995, pp. 71-72.

L. Cippa et al., "Nonvolatile Memories: NOR vs. NAND Architectures", Memories in Wireless Systems, Aug. 2008, pp. 29-53.

Yosuke Komori et al., "Disturbless Flash Memory due to High Boost Efficiency on BICS Structure and Optimal Memory Film Stack for Ultra High Density Storage Device", 2008 Electron Devices Meeting, Dec. 2008, pp. 1-4.

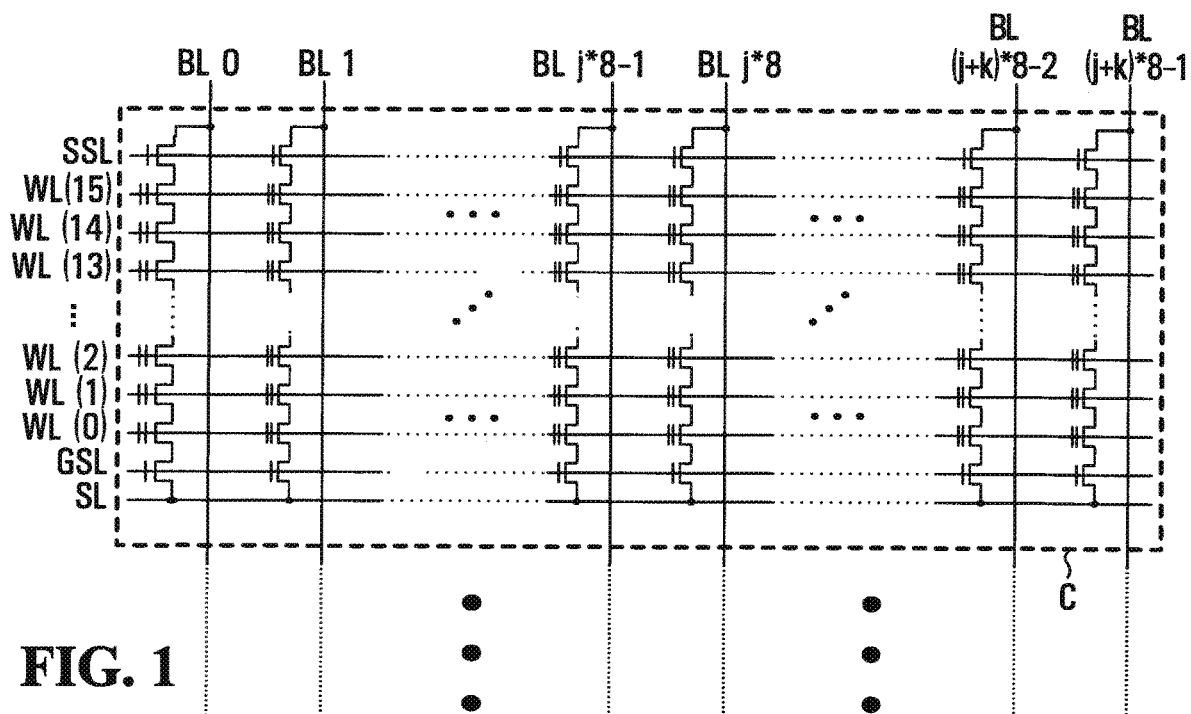
FIG. 1
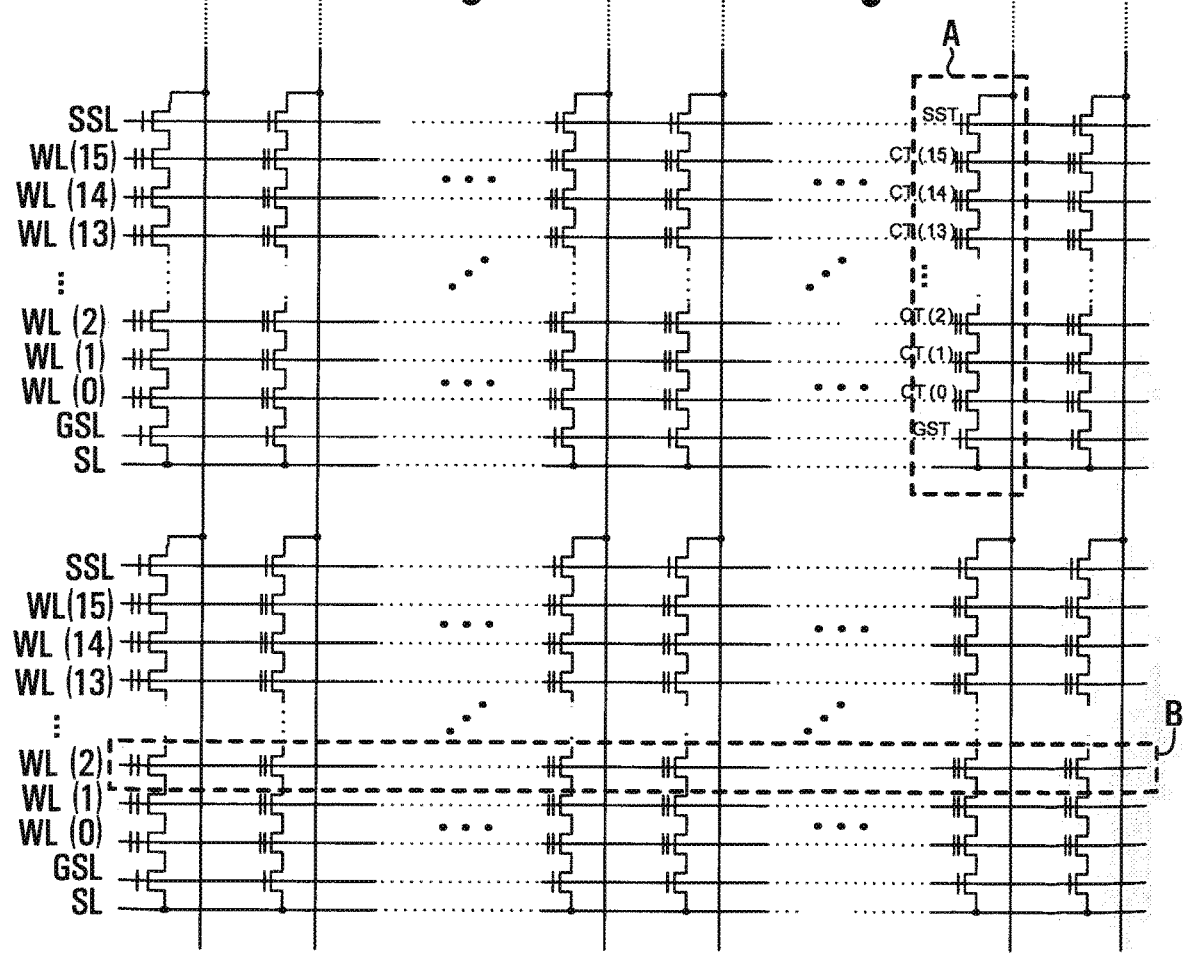

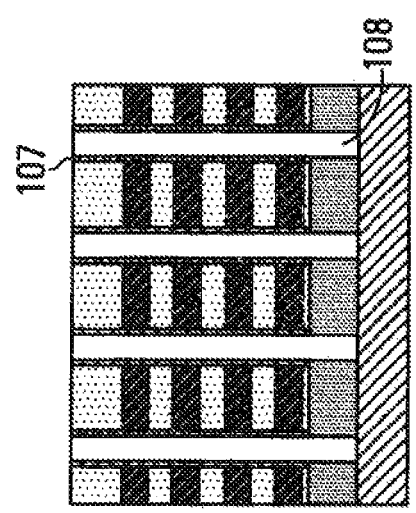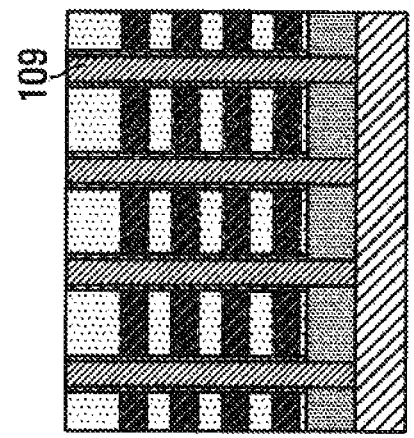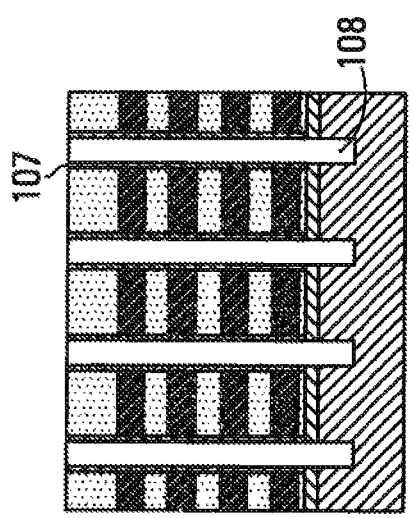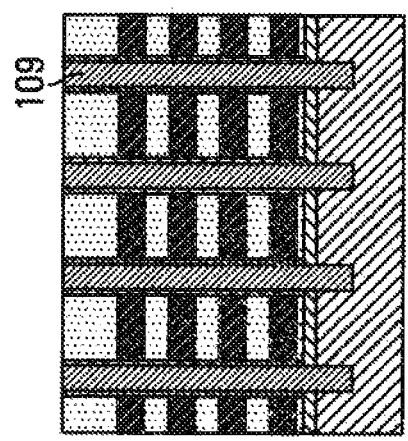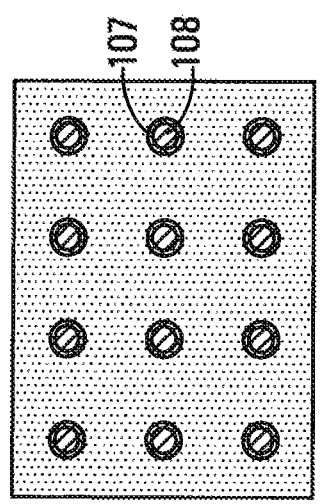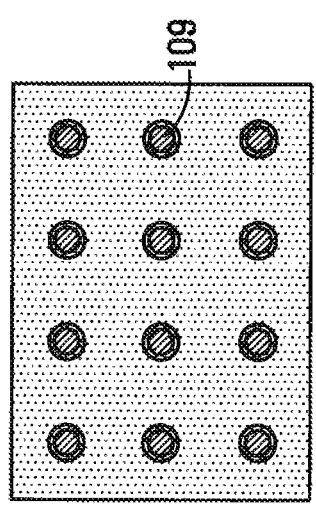
FIG. 29
FIG. 30

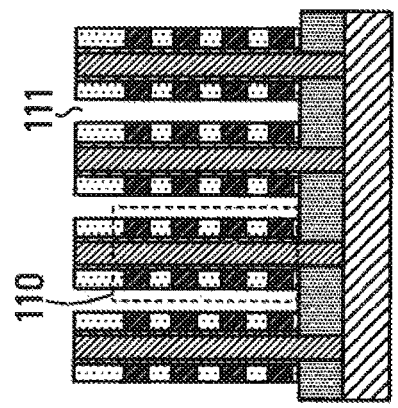
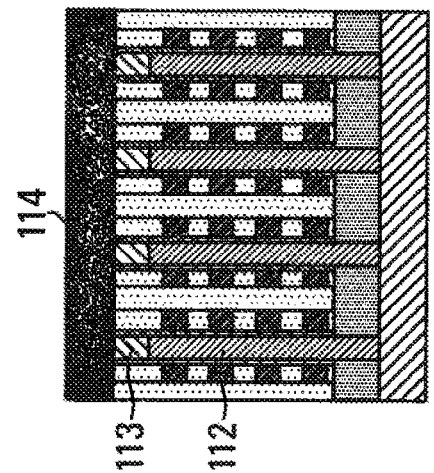
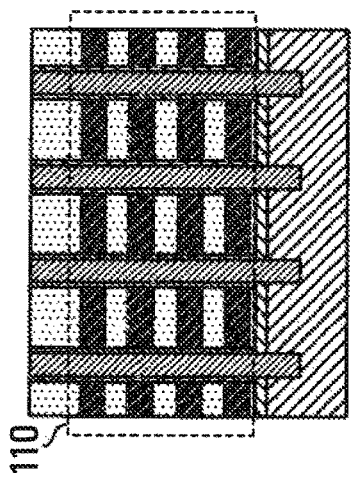
FIG. 32
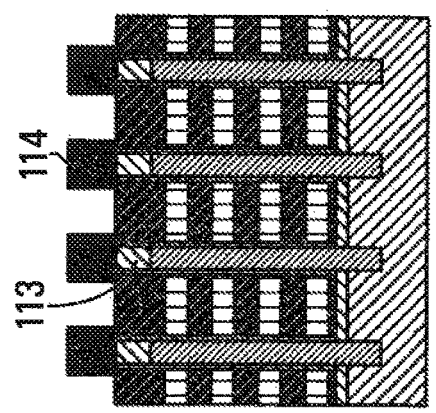
FIG. 33
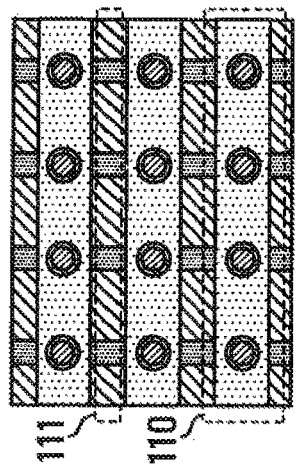
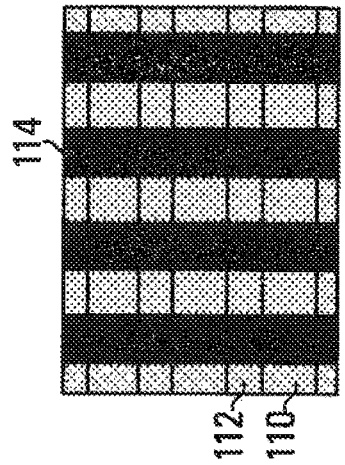

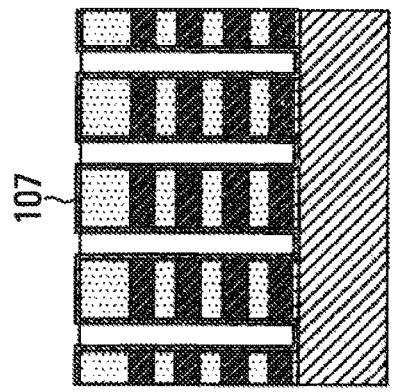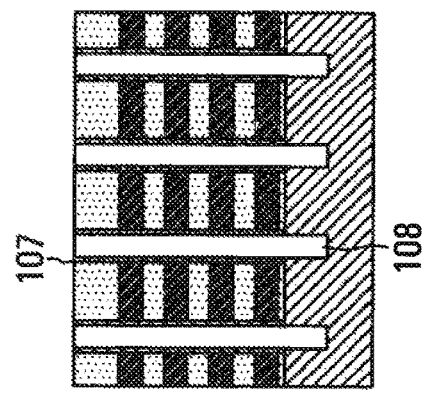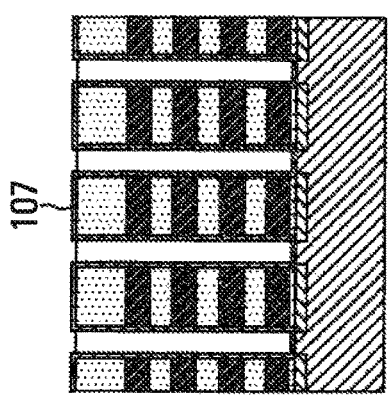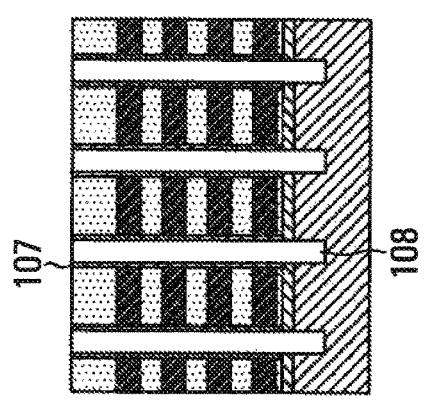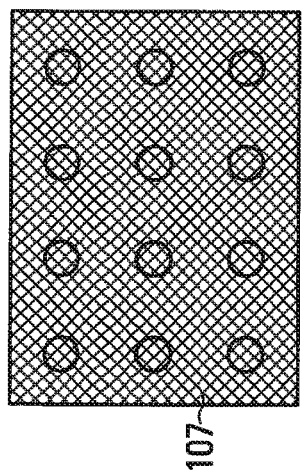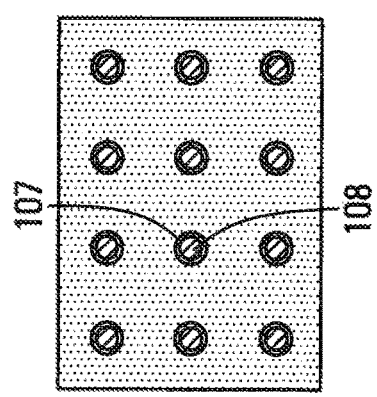
FIG. 38
FIG. 39

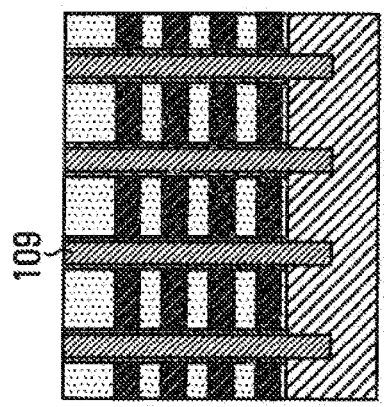
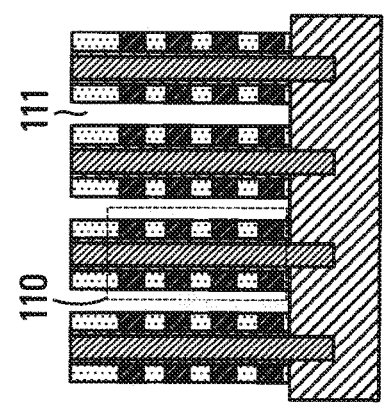
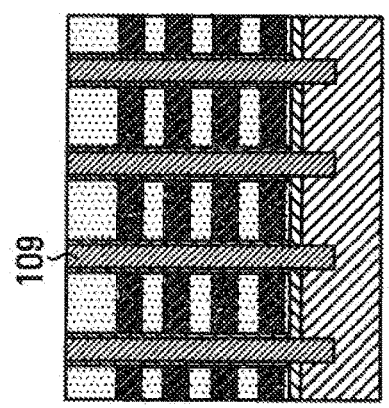
FIG. 40
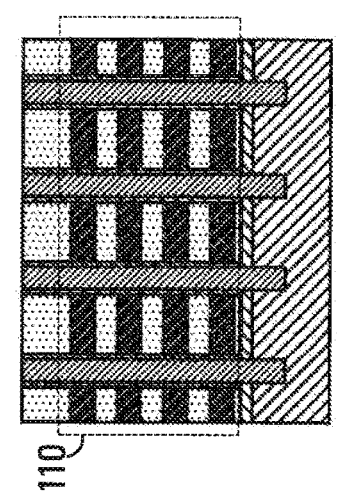
FIG. 41
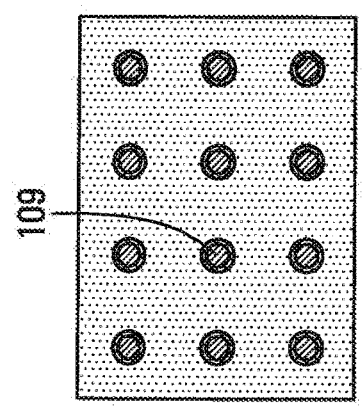
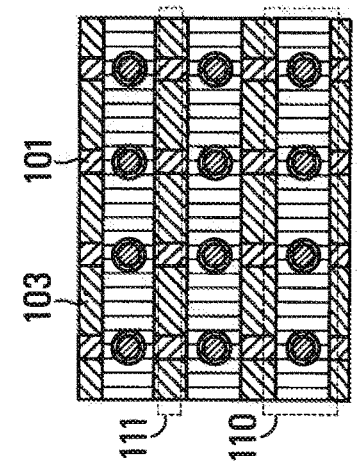

NAND FLASH MEMORY WITH VERTICAL CELL STACK STRUCTURE AND METHOD FOR MANUFACTURING SAME

CROSS REFERENCE TO RELATED APPLICATIONS

The present application is a continuation of application Ser. No. 16/816,520 filed Mar. 12, 2020, which is a continuation of Ser. No. 16/521,066 filed Jul. 24, 2019, now U.S. Pat. No. 10,622,488, which is a continuation of Ser. No. 13/803,085, filed Mar. 14, 2013, now U.S. Pat. No. 10,403,766, which claims the benefit of priority from U.S. Provisional Patent Application No. 61/733,063 filed Dec. 4, 2012 the disclosure of which is expressly incorporated herein by reference in its entirety.

FIELD

The present disclosure relates generally to a semiconductor device. More particularly, the present disclosure relates to a nonvolatile memory.

BACKGROUND

Flash memory is a commonly used type of non-volatile memory in widespread use as storage for consumer electronics and mass storage applications. Flash memory is pervasive in popular consumer products such as digital audio/video players, cell phones and digital cameras, for storing application data and/or media data. Flash memory can further be used as a dedicated storage device, such as a portable flash drive pluggable into a universal serial port (USB) of a personal computer, and a magnetic hard disk drive (HDD) replacement for example. It is well known that flash memory is non-volatile, meaning that it retains stored data in the absence of power, which provides a power savings advantage for the above mentioned consumer products. Flash memory is suited for such applications due to its relatively high density for a given area of its memory array.

SUMMARY

A broad aspect of the disclosure provides a method of manufacturing flash memory with a vertical cell stack structure, the method comprising: forming source lines in a cell area of a substrate having an ion-implanted well and forming an alignment mark relative to the source lines, the alignment mark being formed in the substrate outside the cell area of the substrate; after formation of the source lines, forming cell stacking layers; and after forming the cell stacking layers, forming cell pillars in the cell stacking layers at locations relative to the previously formed source lines using the alignment mark to correctly locate the cell pillars.

Another broad aspect of the present disclosure provides a flash memory comprising: a substrate; a plurality of source lines formed in the substrate; a plurality of cell stacking layers formed on the substrate containing the source lines; a plurality of cell pillars in the cell stacking layers, each cell pillar having a pillar body, each pillar body being such that during an erase operation, the pillar body and the ion-implanted well form a single node; a plurality of bitlines and a plurality of wordlines, the plurality of source lines being parallel to the plurality of bitlines and comprising a respective source line for each bitline.

Another broad aspect of the present disclosure provides a method for making a flash memory device, comprising: forming a cell substrate in a way that a silicon surface has regions with n-type and p-type silicon; depositing cell stacking layers having gate material and interlayer dielectric; and patterning word lines.

Another broad aspect of the present disclosure provides a device having a vertical structure of cells and diffused source lines running in a direction perpendicular to word lines, the device comprising cell pillars and a substrate having an ion-implanted well, wherein the cell pillars are formed so that during an erase operation, each cell pillar and the ion-implanted substrate form a single node.

Another broad aspect of the present disclosure provides a method comprising: forming diffused source lines; forming a cell stack; performing patterning on the cell stack; wherein forming diffused source lines is performed before proceeding with forming the cell stack and performing patterning.

Another broad aspect of the present disclosure provides a method comprising: forming diffused source lines at a same photolithography mask step used to define a location of an alignment mark.

Other aspects and features of the present disclosure will become apparent to those ordinarily skilled in the art upon review of the following description of specific embodiments of the present disclosure in conjunction with the accompanying figures.

BRIEF DESCRIPTION OF THE DRAWINGS

Embodiments of the present disclosure will now be described, by way of example only, with reference to the attached Figures, wherein:

FIG. 1 illustrates a string (A), page (B) and block (C) in a NAND Flash cell array;

FIG. 29 illustrates a cell pillar hole second etching manufacturing step;

FIG. 30 illustrates a cell body fill manufacturing step;

FIG. 32 illustrates a word line patterning manufacturing step;

FIG. 33 illustrates a String drain n+ implant step and bit line formation manufacturing step;

FIG. 38 illustrates a cell gate dielectric deposition manufacturing step;

FIG. 39 illustrates a cell pillar hole 2nd etching manufacturing step;

FIG. 40 illustrates a cell body fill manufacturing step;

FIG. 41 illustrates a word line patterning manufacturing step;

DETAILED DESCRIPTION

Figure 2:
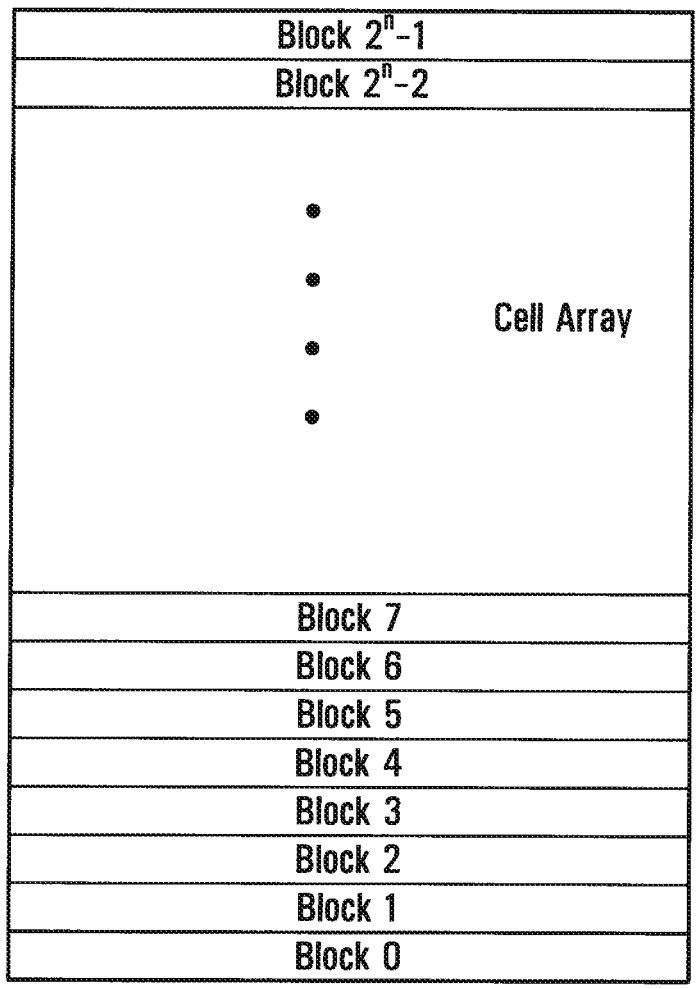
FIG. 2 illustrates a NAND flash cell array structure.

Generally, the present disclosure relates to a nonvolatile memory device, such as, for example, a flash memory device. The flash memory may comprise NAND flash memory and other types of flash memories. A general non-limiting example description of NAND Flash memory devices will be given in subsequent sections.

The given examples throughout the present disclosure will be shown with the assumption that junctionless NAND cell transistors consist of n-channel transistors on p-type substrate. However, the present disclosure is not restricted to this case. N and p-type impurity regions may be interchanged so as to form p-channel transistors on n-type substrate.

The proposed method and apparatus may be applied to, for example:
1. NAND Flash memory devices with cell strings being located in a way that cell are stacked in a direction perpendicular to the chip surface and cell strings are aligned in a way as to form a pillar vertically to the chip surface.
2. The source of the cell string is located below the layers forming the cells at the bottom of each cell pillar and is located in the cell array substrate formed as an n-type diffusion layer.
3. When cell transistors (including the string select transistor and ground select transistor) of a string are turned on, and a channel is formed in the pillar, the channel of the transistor most close to the string source (usually the ground select transistor) is electrically connected to the source of the cell string and thus the source line.
4. Sources of adjacent cell strings are connected with each other forming a source line consisting of an n-type diffusion layer.
5. The p-type bodies of the pillars are electrically connected to the underlying p-type substrate of the cell array without a junction in-between.

Organization of a NAND Flash Memory Cell Array

The basic cell array organization of NAND flash memory devices will be described. FIG. 1 serves as an illustration to describe the terms string, page and block in a NAND Flash memory device.

A NAND cell string as illustrated in the box "A" of FIG. 1 consists of at least one string select transistor (SST) which is placed in series with the cell transistors and with one terminal (hereinafter referred to as the drain) being connected to the bit line. A NAND cell string also contains a certain number of memory cell transistors and at least one ground select transistor which is serially connected between the cell transistors and the source line.

Although in this figure the string consists of 16 cells, the present disclosure is not restricted to any specific number of cells per string. The number of cells per string varies, with 4 cells per string, 8 cells per string, 32 cells per string, 64 cells per string, 128 cells per string or any other number >1 also being possible embodiments.

Memory cell gates in FIG. 1 are coupled to word lines (commonly abbreviated WL in embodiment of the present disclosure) 0 to 15. The gate of the string select transistor (SST) is connected to a string select line (SSL) while the drain of the string select transistor (SST) is connected to a bit line (BL). The gate of the ground select transistor (GST) is connected to a ground select line (GSL) while the source of the ground select transistor (GST) is connected to a source line (SL or CSL).

To specify a direction within a string, the direction towards the SSL of a string will be referred to as "drain direction" or "drain side" and the direction towards the GSL of a string will be referred to as "source direction" or "source side" hereinafter.

The box "B" in FIG. 1 illustrates a common example of a page in a NAND Flash device. A page is the smallest unit addressed by a row address. The smallest unit for which a read or program operation can be performed is also one page. In some common examples one page is identical to all cells connected to one word line. However, other examples also exist where cells connected to a certain word line are subdivided into multiple subgroups which thus constitute multiple pages per word line, whereby each one of the multiple pages in one word line has a different row address. In the case of multiple bit storage in one physical cell, different bits can belong to different pages although they are physically located in the same cell transistor and thus connected to the same word line. Hereinafter, the proposed technique will be described using but not be restricted to the example in FIG. 1 where each word line corresponds to one page.

The box "C" in FIG. 1 illustrates the meaning of a cell block. It is constituted by the entirety of strings which share the same word lines, string select lines and ground select lines. In the most common examples of NAND Flash memory devices the smallest unit for which an erase operation can be performed is one cell block, which is therefore often named "erase block".

Figure 3:
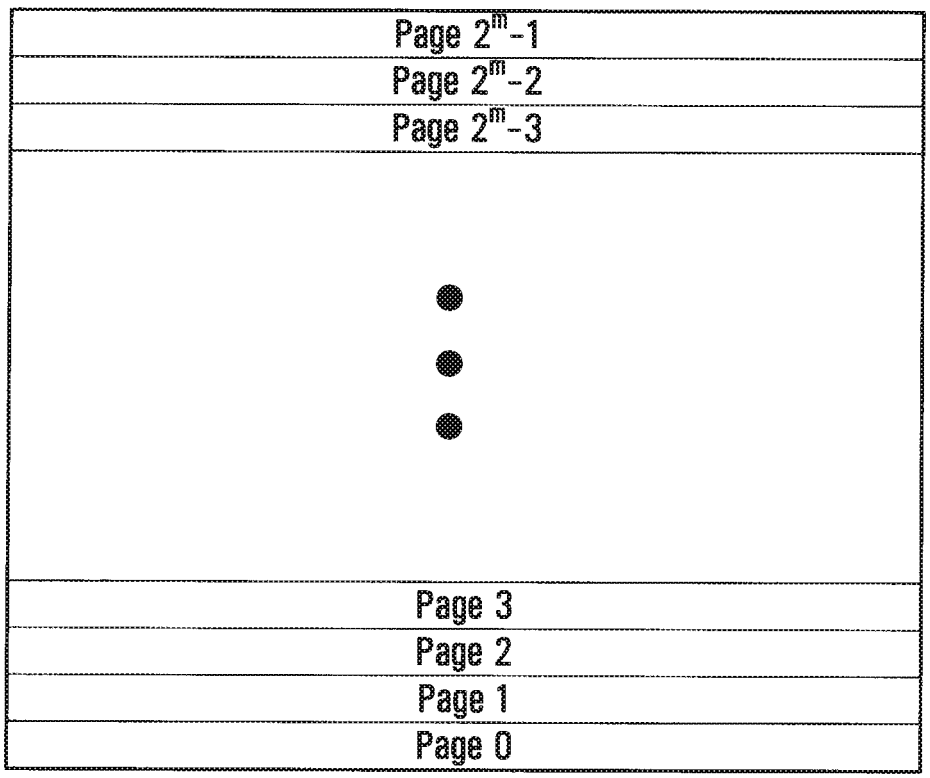
FIG. 3 illustrates a structure of one NAND flash block consisting of 2m programmable pages.

Assuming that the row address is made of n bits for the block address and m bits for the page address, FIG. 2 illustrates the cell array structure of NAND flash memory. It consists of $2^n$ erase blocks, with each block subdivided into $2^m$ programmable pages as shown in FIG. 3.

Figure 4:
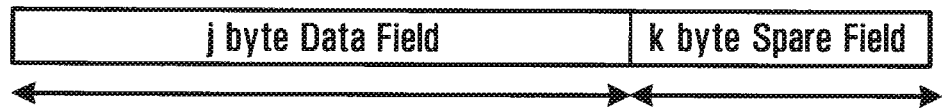
FIG. 4 illustrates a NAND flash page structure.

Each page consists of (j+k) bytes (times 8 bits) as shown in FIG. 4. The pages are further divided into a j-byte data storage region (data field) with a separate k-byte area (spare field). The k-byte area is typically used for error management functions.

Figure 5:
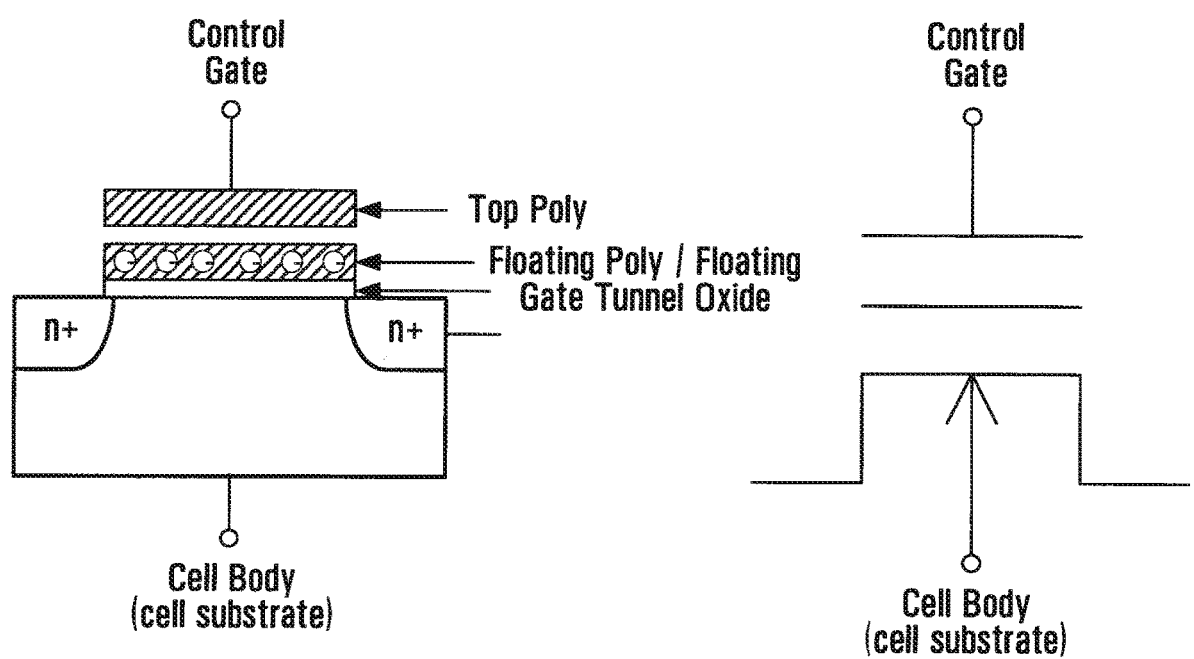
FIG. 5 illustrates a NAND flash cell transistor.

1 page=(j+k) bytes
1 block=$2^m$ pages=(j+k) bytes*$2^m$
Total memory array size=$2^n$ blocks=(j+k) bytes*$2^{2m+n}$
Basic Cell Operation of Erase, Program and Read Examples of erase, program and read operations in a NAND flash memory are described as follows. The structure of a typical NAND Flash cell is illustrated in FIG. 5. NAND flash cell transistors store information by trapping electrons in a floating node either by a technology commonly referred to as "floating gate" or by a technology commonly referred to as "charge trap". The electrons trapped in the floating node of a cell transistor modify the threshold voltage of this cell transistor to different levels depending on the data (0 or 1) stored in the cell. The threshold voltage of the cell transistor influences the channel resistance of the cell transistor.

Figure 6:
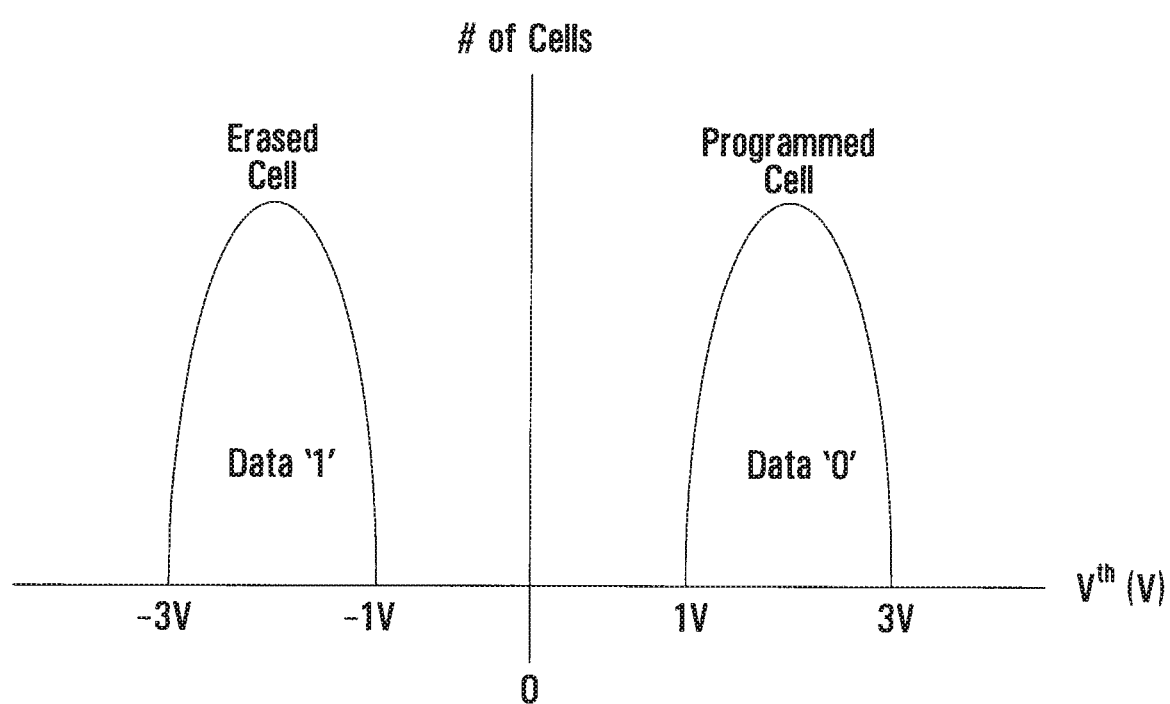
FIG. 6 illustrates a cell threshold voltage distribution for single level cells (1 bit-2 states)
Figure 7:
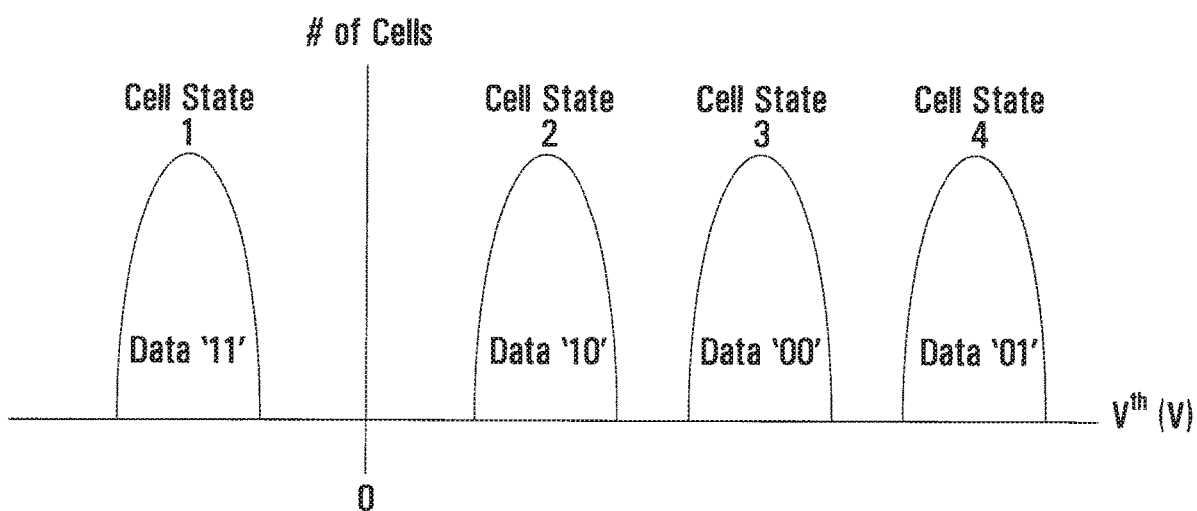
FIG. 7 illustrates a cell threshold voltage distribution for multi-level cells (2 bit-4 states)

In some common examples memory cells store two logic states; data '1' and data '0' and each memory cell corresponded to one bit. In this case the flash memory cell can have one of two threshold voltages corresponding to data '1' and data '0'. The cell threshold voltage distribution for these SLC (single level cells) is shown in FIG. 6. In some widely used NAND Flash devices cells can also be programmed to more than two threshold levels and thus multiple bits can be stored in one physical cell (see FIG. 7), which are referred to as MLC (multi-level cells). Even if no explicit reference is made to multiple bit storage examples of the proposed systems and methods can be applied equally to NAND memory devices with single and multiple bit storage per cell.

Figure 8:
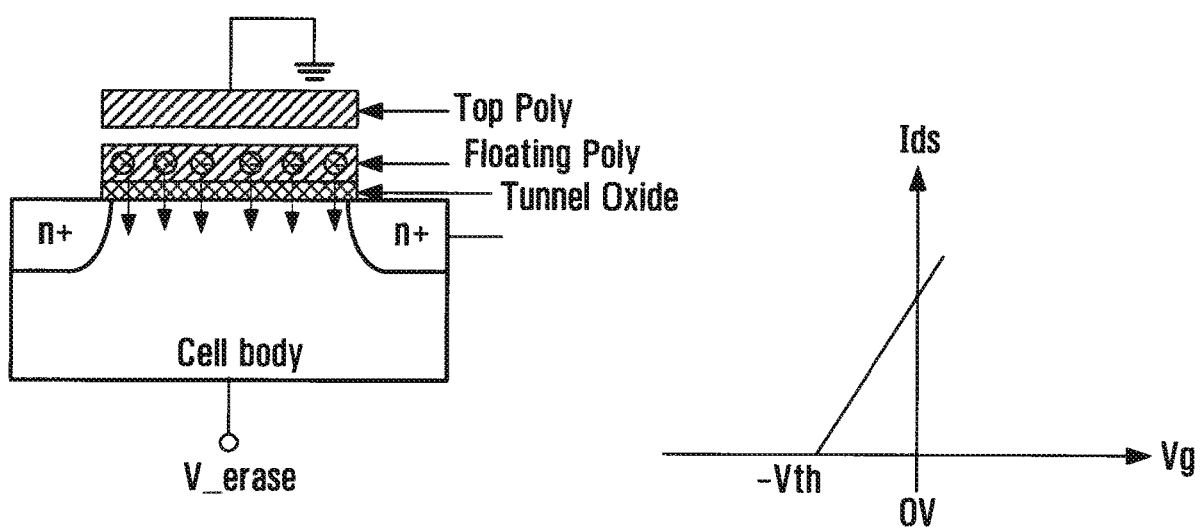
FIG. 8 illustrates an erase operation by Fowler-Nordheim (F-N) tunneling.

Typically a NAND flash memory cell is erased and programmed by Fowler-Nordheim (F-N) tunneling. During an erase operation, the top poly electrode (i.e. top gate) of the cell is biased to Vss (ground) while the cell body is biased to an erase voltage V_erase and the source and drain of the cell are floated (in the case that the source and the drain consist of N+ diffusion layers they are automatically biased to V_erase due to junction-forward-bias from the cell body to the source/drain). With this erase bias condition, trapped electrons (charge) in the floating poly (i.e. floating gate) are emitted uniformly to the substrate through the tunnel oxide as shown in FIG. 8. The cell threshold voltage (Vth) of the erased cell becomes negative as also shown in FIG. 8. In other words, the erased cell transistor is in an on-state with a gate bias Vg of 0V.

During program operation, on the contrary, the top poly (i.e. top gate) of the cell is biased to a program voltage Vpgm while the substrate, source and drain of the cell are biased to Vss (ground). More precisely, the high Vpgm voltage (e.g. 20V) induces a channel under the tunnel oxide. Since this channel is electrically connected to the source and drain which are tied to Vss=0V, the channel voltage Vch is also tied to ground. By the difference in voltage Vpgm−Vch, electrons from the channel are uniformly injected to the floating poly (floating gate) through the tunnel oxide as shown in FIG. 9.

Figure 9:
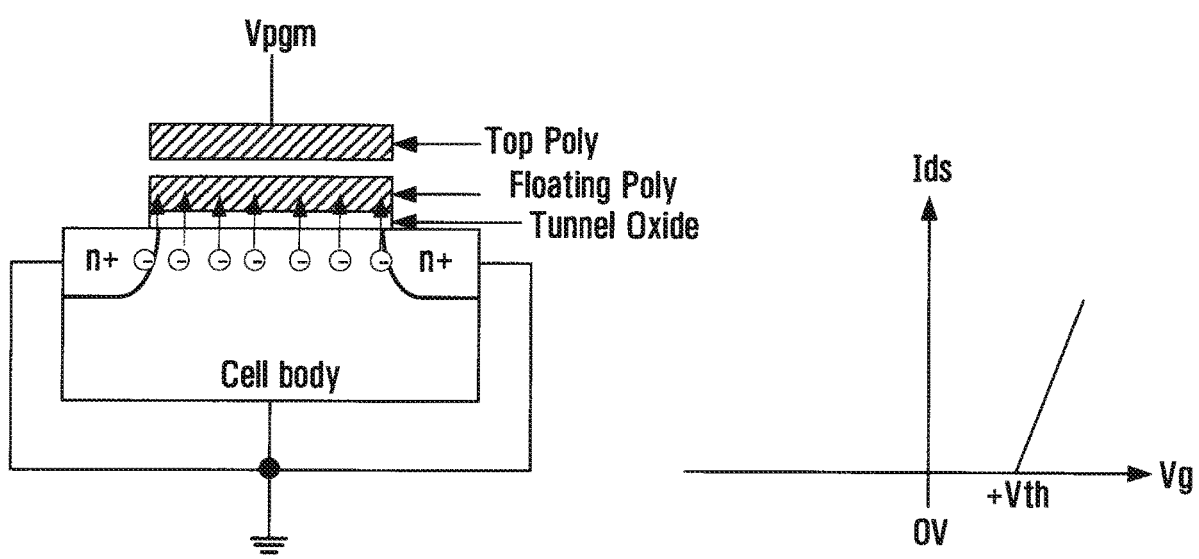
FIG. 9 illustrates a program operation by Fowler-Nordheim (F-N) tunneling.

The cell threshold voltage Vth of the programmed cell becomes positive as also shown in FIG. 9. In other words, the programmed cell is turned off with a gate bias Vg of 0V).

Figure 10:
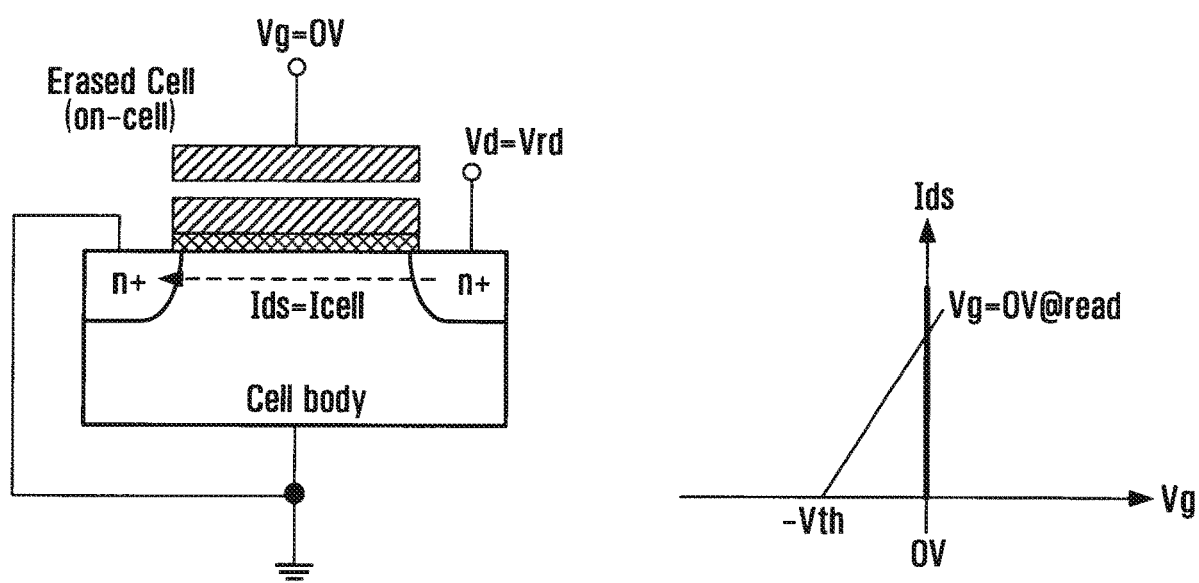
FIG. 10 illustrates a read erased cell (data '1')
Figure 11:
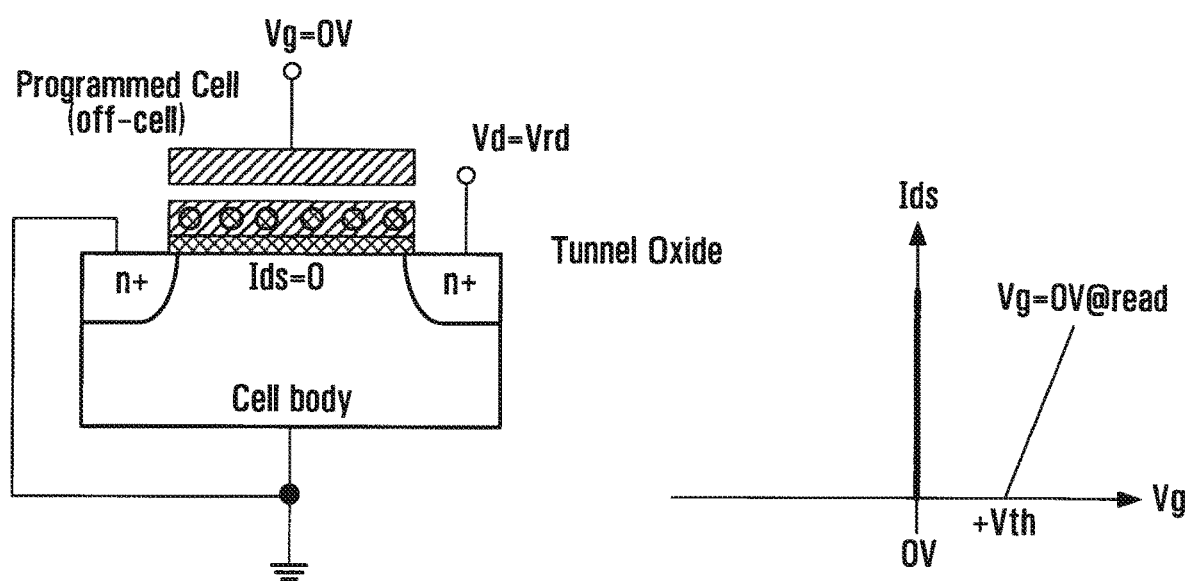
FIG. 11 illustrates a read programmed cell (data '0')

In order to read cell data, the gate and drain of the selected cells are biased to 0V and a read voltage Vrd, respectively while the source of the selected cells are set to 0V. If the cell is in an erased state as shown in FIG. 10, the erased cell has a negative threshold voltage and thus a cell current (Icell) from the drain to the source flows under the given bias condition. Similarly if the cell is in a programmed state as shown in FIG. 11, the programmed cell has a positive threshold voltage and there is no cell current from the drain to the source under the given bias condition. Finally a sense amplifier connected to each bit line senses and latches cell data; an erased cell (on-cell) is sensed as data '1' and a programmed cell (off-cell) is sensed as data '0'.

Page Read

Figure 12:
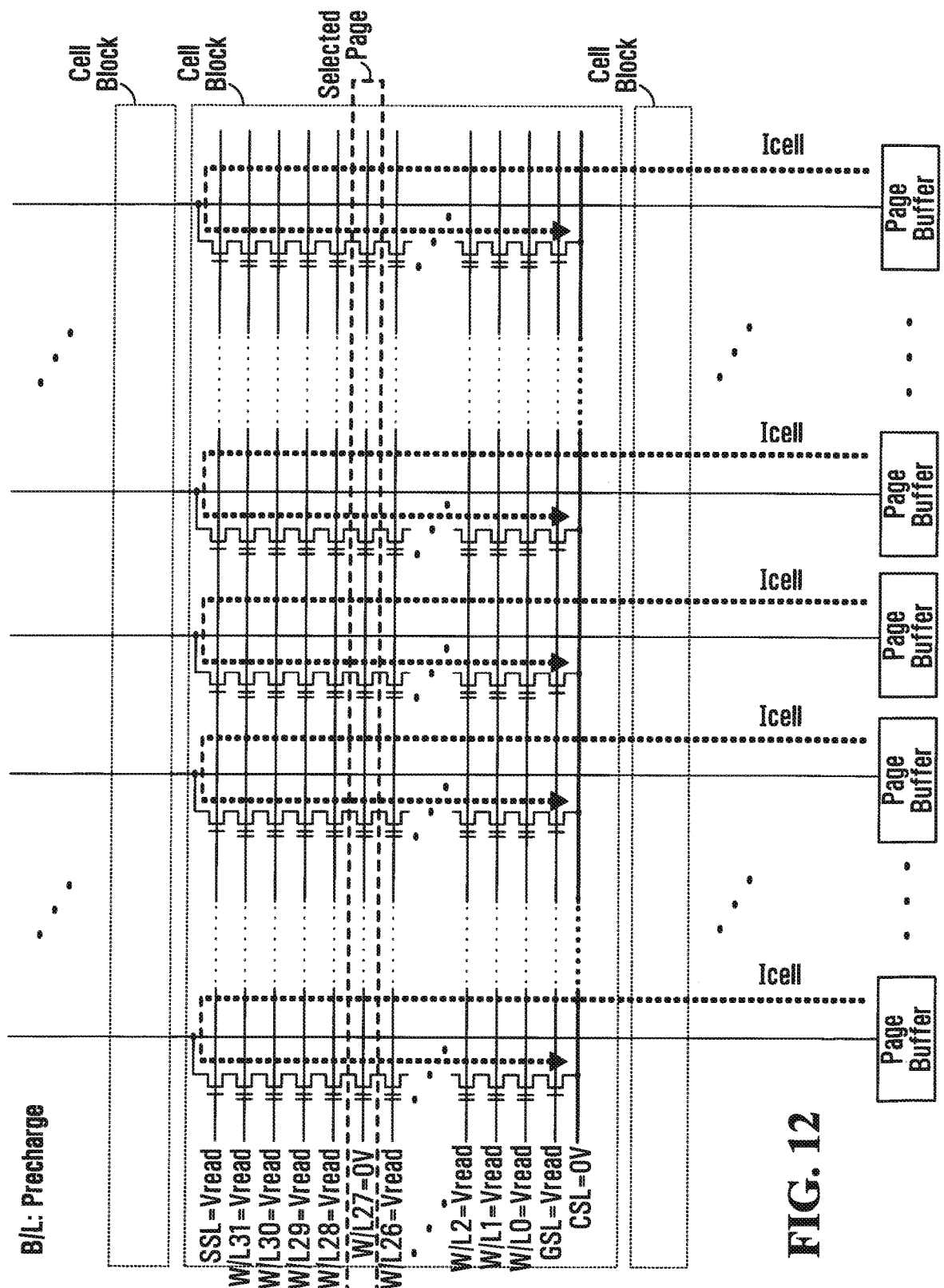
FIG. 12 illustrates page read bias conditions.

FIG. 12 shows bias conditions during page read operations. The selected word line is set to 0V while unselected word lines, SSL, and GSL are biased to a read pass voltage Vread that is sufficiently high to render unselected cell transistors conductive regardless of their programmed state (i.e. cell Vth). The common source line CSL is set to ground. With read bias conditions, the Vth of the selected cell determines cell current Icell. This cell current Icell is sensed by a bit line sense amplifier in a page buffer. An entire page is read in parallel. In order for a read operation to work without disturbance, the source line needs to be solidly tied to ground without any modification by the cell currents.

Block Erase in NAND Flash

Figure 13:
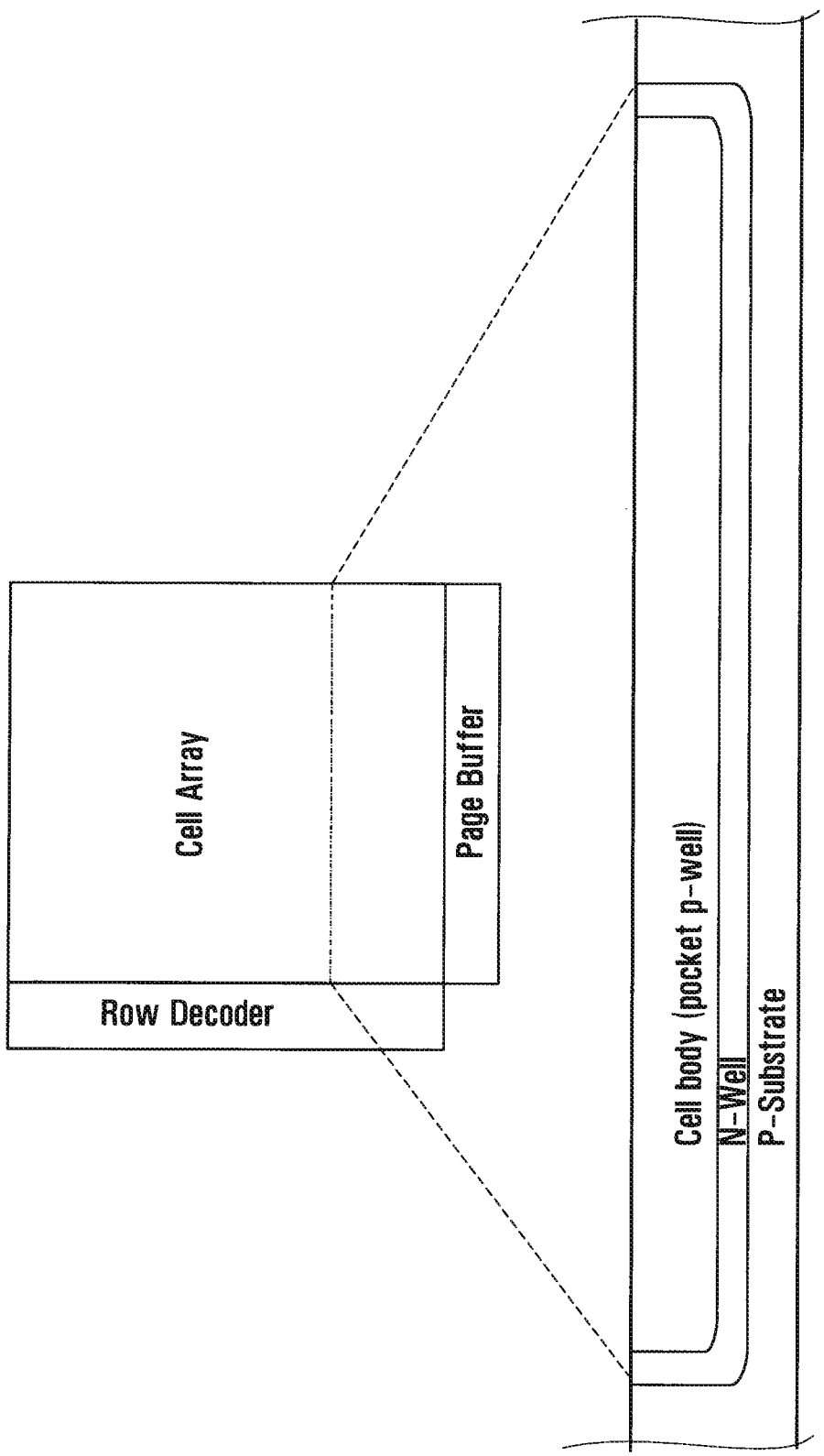
FIG. 13 illustrates a cell substrate structure.

The bias conditions of various nodes in the cell array including the cell body will be described. A detailed description can also be found in, for example, U.S. Pat. No. 5,473,563 in which non-volatile semiconductor memories using arrays of cell units include memory transistor divided into several memory blocks, each having certain number of cell units, with erasable selectable memory blocks. FIG. 13 shows the structure of the cell array substrate for most widely used NAND Flash devices. The cell body is formed by a pocket p-well which is isolated from the p-substrate of chip.

Figure 14:
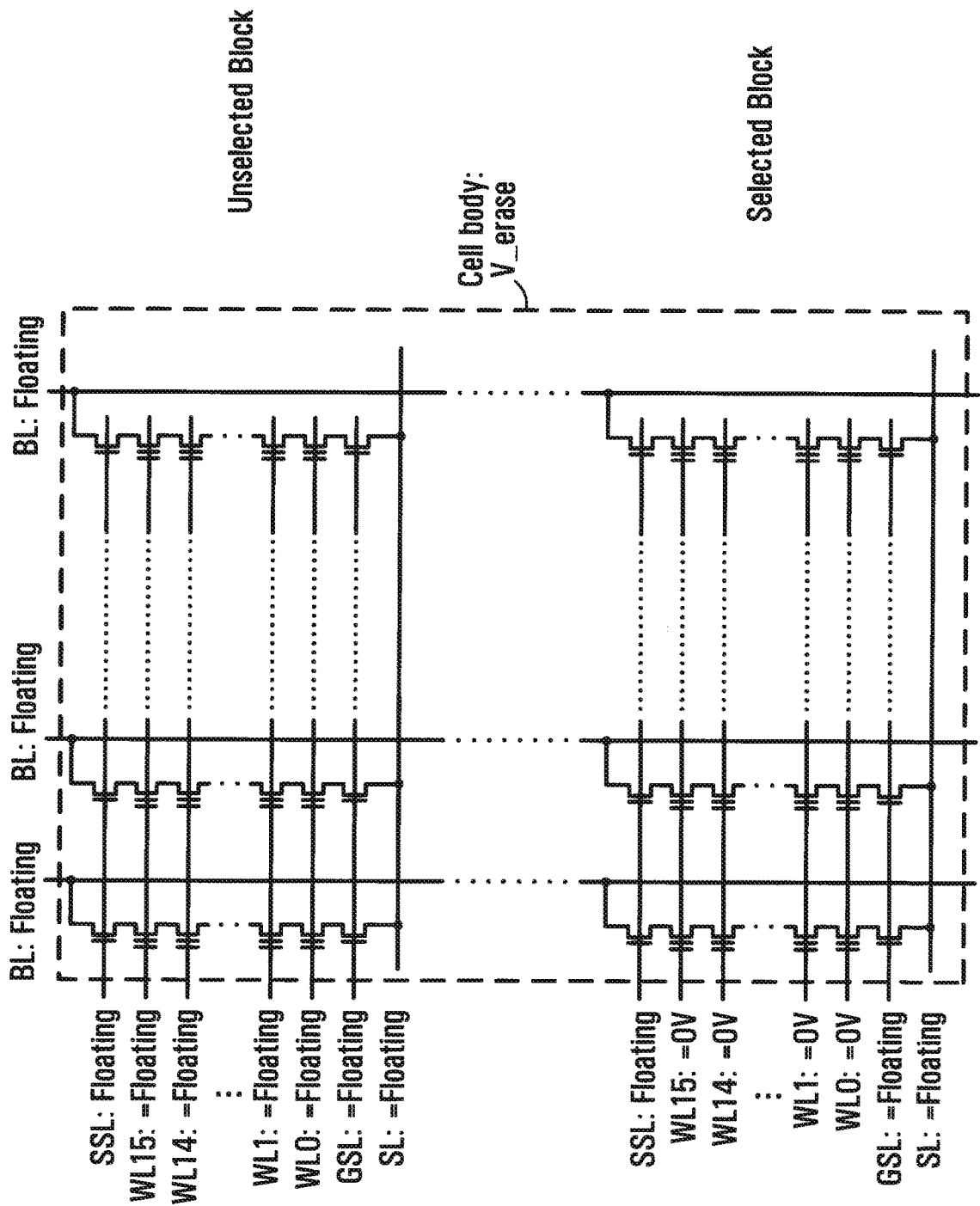
FIG. 14 illustrates a bias condition during erase for a selected and an unselected block.

FIG. 14 and Table 1 show typical bias conditions during erase operations. The cell body is biased to the erase voltage V_erase while the floating bit lines and the source lines (SL) in the selected block are clamped to V_erase-0.6V through the S/D diodes of the SSL and GSL transistors. At the same time all word lines in the selected block are biased to 0V while the string select line (SSL) and the ground select line (GSL) are biased to erase voltage V_erase. Therefore all cells within the selected block are erased by F-N tunneling as described in previous section. Because the substrate of the cells is biased to erase voltage V_erase and the source/drain/substrate of cells in the selected block are electrically connected, the erase operation must occur on a block basis. In other words, the minimum erasable array size is a block.

Because of the block basis erase operations, erasure of memory cells in unselected blocks sharing the same cell substrate must be prevented (i.e. erase inhibit). For this purpose the self-boosting erase inhibit scheme has been proposed (e.g., U.S. Pat. No. 5,473,563). To prevent erasure of memory cells in unselected blocks, all word lines in unselected blocks are floated during erase operations. Therefore floated word lines in unselected blocks are boosted to nearly erase voltage V_erase by capacitive coupling between the substrate and word lines (the exact value depending on the coupling ratio the word line level lies around 90% of V_erase when the substrate of the cell array goes to V_erase. The boosted voltage of word lines in unselected blocks reduces the electric field between the cell substrate and word lines. As a result erasure of memory cells in unselected blocks is prevented.

TABLE 1

Bias Conditions during Erase

| | Selected Block | Unselected Block |
|---|---|---|
| Bitlines (BL) | Clamped to V_erase-0.6 V | Clamped to V_erase-0.6 V |
| String Select Line (SSL) | Boosted to approx. 90% of V_erase | Boosted to approx. 90% of V_erase |
| Wordlines (WL0~WL15) | 0 V | Boosted to approx. 90% of V_erase |
| Ground Select Line (GSL) | Boosted to approx. 90% of V_erase | Boosted to approx. 90% of V_erase |
| Source Line (SL) | Clamped to V_erase-0.6 V | Clamped to V_erase-0.6 V |
| Cell body | V_erase | V_erase |

The mentioned bias conditions describe the most widely used schemes. Variations do exist for specific cell technologies where the cell body is an electrically isolated node and its potential is raised during potential by GIDL charge injection from the source line and where the source line is not left floating but is raised to an erase voltage level V_erase.

Page Program and Program Inhibit

The program operation of a single cell was described in a previous section, where it was described that a high program voltage Vpgm is applied to the control gate, whereas the channel voltage Vch under the tunnel oxide of the cell transistor is tied to the ground level Vss. Cells which are intended to be programmed during program operation will be referred to as "program cells" or "selected cells" hereinafter.

A string to which a cell to be programmed during program operation belongs will be referred to as a "selected string" or "program string", and bit lines which are connected to such strings will be referred to as "program bit lines" or "selected bit lines" hereinafter. Strings of which the cells should not be programmed during the program operation will be referred to as "unselected strings" or "program inhibited strings", and bit lines which are connected to such strings will be referred to as "program inhibit bit lines" or "unselected bit lines" hereinafter.

Expanding the program scheme to entire pages and strings which belong to one block, a common method will be described for supplying the needed bias conditions for cell programming during program operation. Furthermore, a method referred to as channel self-boosting program inhibit will be described which ensures that no cells are programmed inadvertently during program operation which are connected to selected word lines and whose control gates are therefore biased with Vpgm but which belong to unselected strings and are not intended to be programmed.

Figure 15:
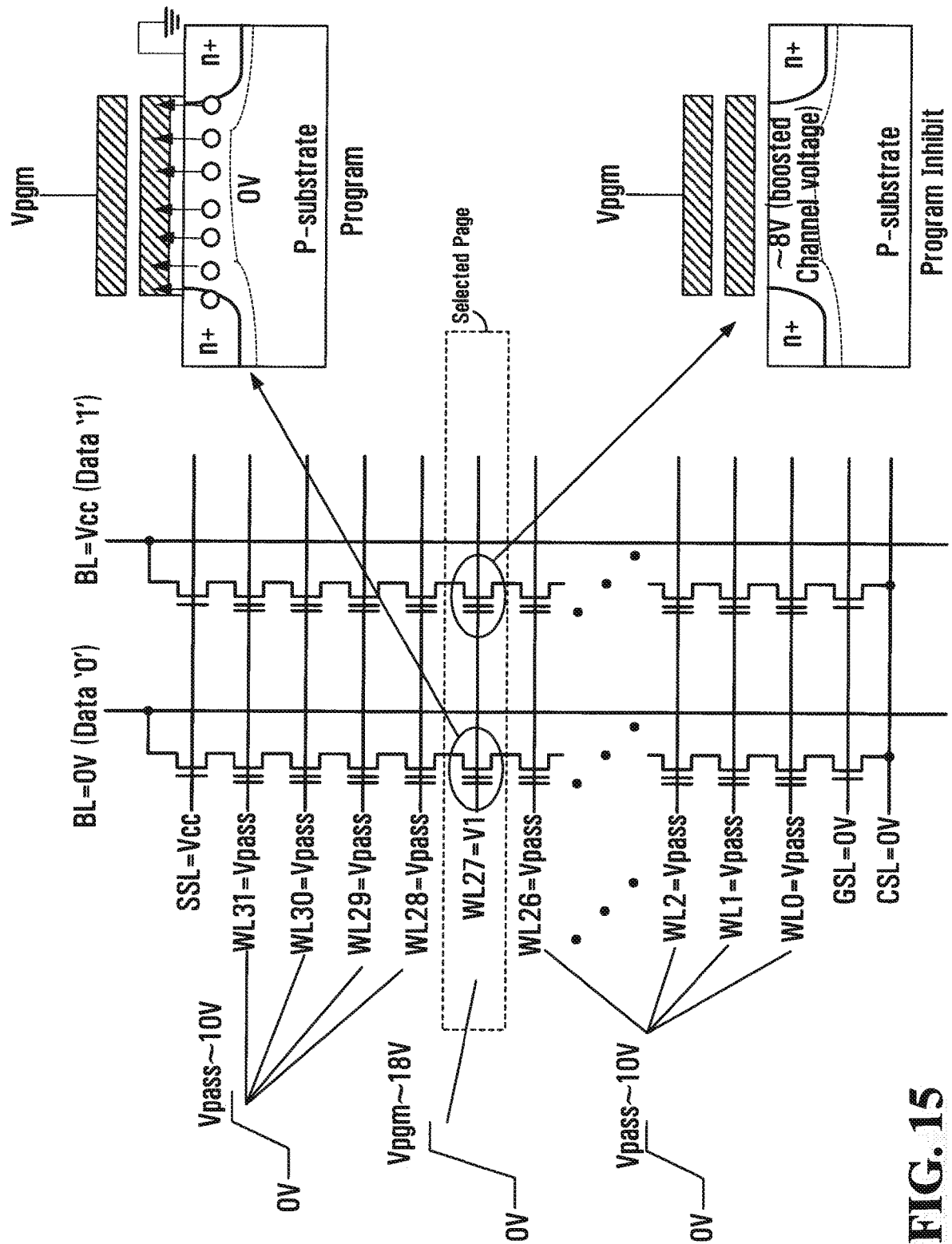
FIG. 15 illustrates page program bias conditions.

FIG. 15 depicts known page program bias conditions (see, e.g., Kang-Deog Suh et al., "A 3.3 V 32 Mb NAND Flash Memory with Incremental Step Pulse Programming Scheme," IEEE J Solid-State Circuits, vol. 30, no. 11, pp. 1149-1156, April 1995). FIG. 15 is used to describe the program and program inhibit operations of NAND Flash devices. Hereby the so-called channel self-boosting program inhibit scheme which is used in some existing techniques will be described. The needed bias conditions are applied to selected cells as follows in the most common technique:

The program voltage Vpgm is applied to the control gate of a selected cell through the word line to which the program cell is connected. For brevity this word line will be referred to as "selected word line" hereinafter. The SSL transistor of the selected string is turned on with Vcc applied to the SSL and the GSL transistor turned off. The bit line voltage for a selected cell to be programmed with data "0" is set to Vss=0 V. Thus the ground level Vss is supplied to the channel of the selected cell through the program bit line and the SSL to which this particular string is connected to and through the serially connected cell transistors on the drain side of the selected cell between the selected cell and the SSL. These "drain side" cells are in a turned on state with Vpass applied to their control gates to be able to pass on the channel voltage Vss. For another reason related to program inhibit described below, source side cells are also turned on with Vpass applied to their control gates in most existing techniques. A continuous channel is formed from the bit line to the selected cell (and beyond) with a channel voltage Vch of 0V. When the program voltage Vpgm is applied to the gate of a selected cell, the large potential difference between gate and channel level Vch results in F-N tunneling of electrons into the floating gate.

For program inhibited cells (i.e. cells which should stay in an erased state with data '1') and program inhibited strings the connected program inhibit bit line is set to Vcc. For program inhibit, the bit line level of Vcc initially precharges the associated channel through the turned on SSL transistor, the gate of which is biased also with Vcc as it is connected to the same SSL which also turns on the SSL transistors of program strings. The coupled channel voltage rises, and once the channel voltage reaches Vcc-Vth (SSL) the SSL transistor shuts off and the string channel of the program inhibit string becomes a floating node.

Once the word lines of the unit string rise during program operation (selected word line to the program voltage Vpgm and unselected word lines to the pass voltage Vpass), the series capacitances through the control gate, floating gate, channel, and bulk are coupled and the channel potential Vch is boosted automatically beyond the precharge level of Vcc-Vth(SSL). Hereby the word lines on the source side of the selected cell are also raised to Vpass to participate in the channel-boosting. It was shown previously [e.g., Kang-Deog Suh et al., "A 3.3 V 32 Mb NAND Flash Memory with Incremental Step Pulse Programming Scheme," IEEE J Solid-State Circuits, vol. 30, no. 11, pp. 1149-1156, April 1995] that the floating channel voltage rises to approximately 80% of the gate voltage. Thus the channel voltages of program inhibited cells are boosted to approximately 8 V in the case that Vpgm ~15.5-20 V and Vpass ~10 V are applied to the control gates. This high channel voltage prevents F-N tunneling in the program inhibited cells.

Figure 16:
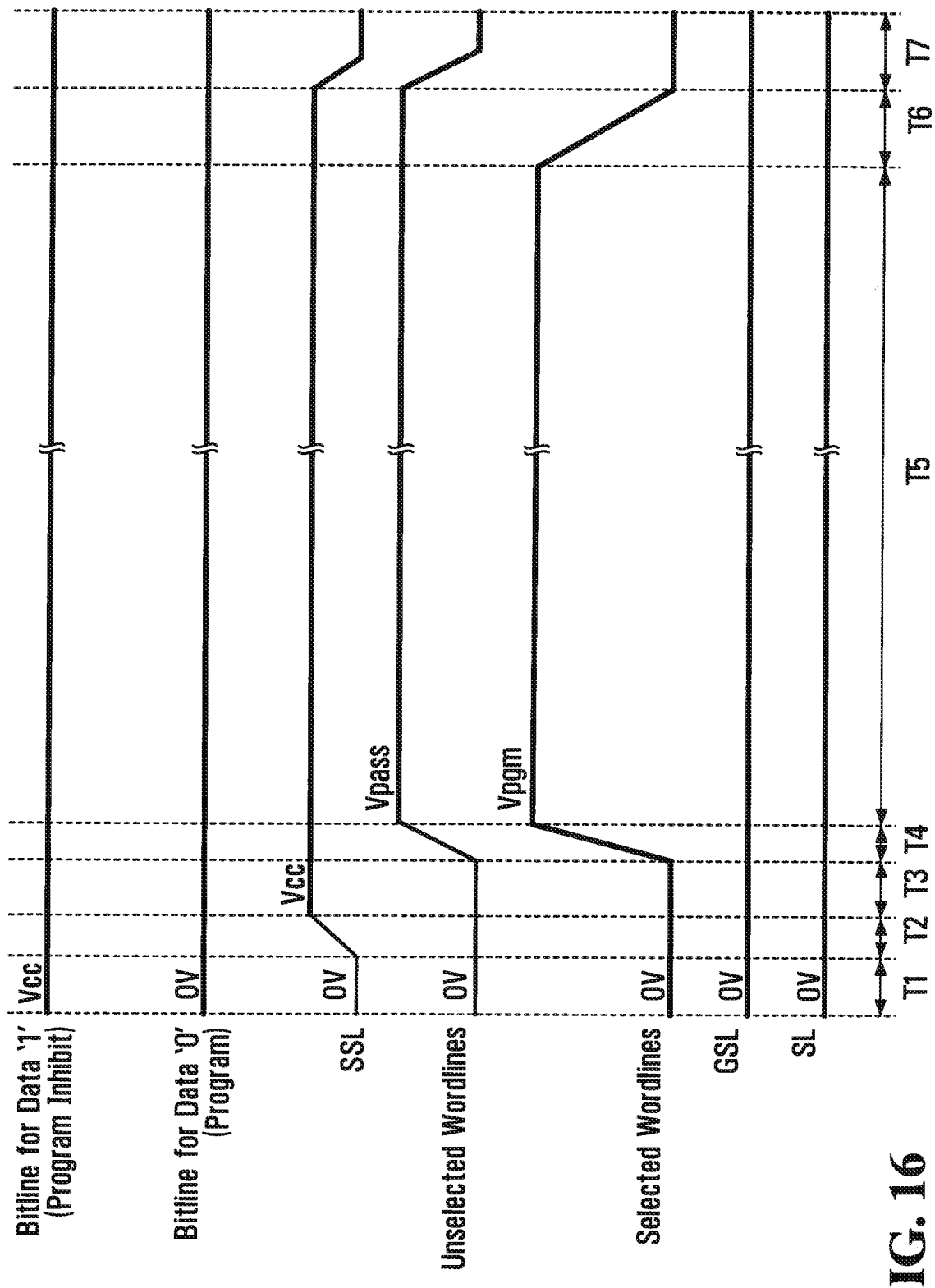
FIG. 16 illustrates program timing.

FIG. 16 shows an example of timing the voltages during program operation. Numerous variations of this program timing scheme exist including the application of multiple pulses for Vpgm and Vpass. Although the embodiments of the present disclosure will be described using the program timing given in FIG. 16, they are not restricted to any program timing scheme in particular.

Vertical Cell Transistors

Figure 17:
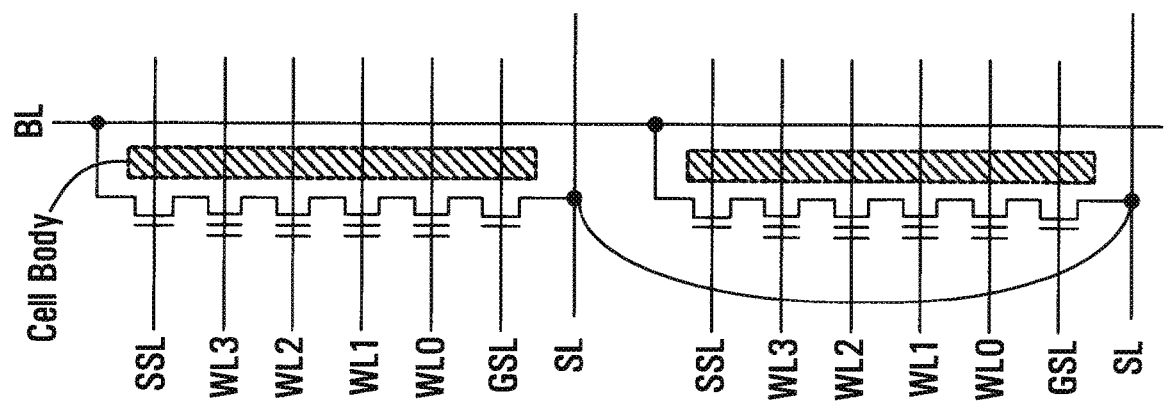
FIG. 17 illustrates vertical pillar NAND Flash strings with electrically isolated pillar bodies.
Figure 17:
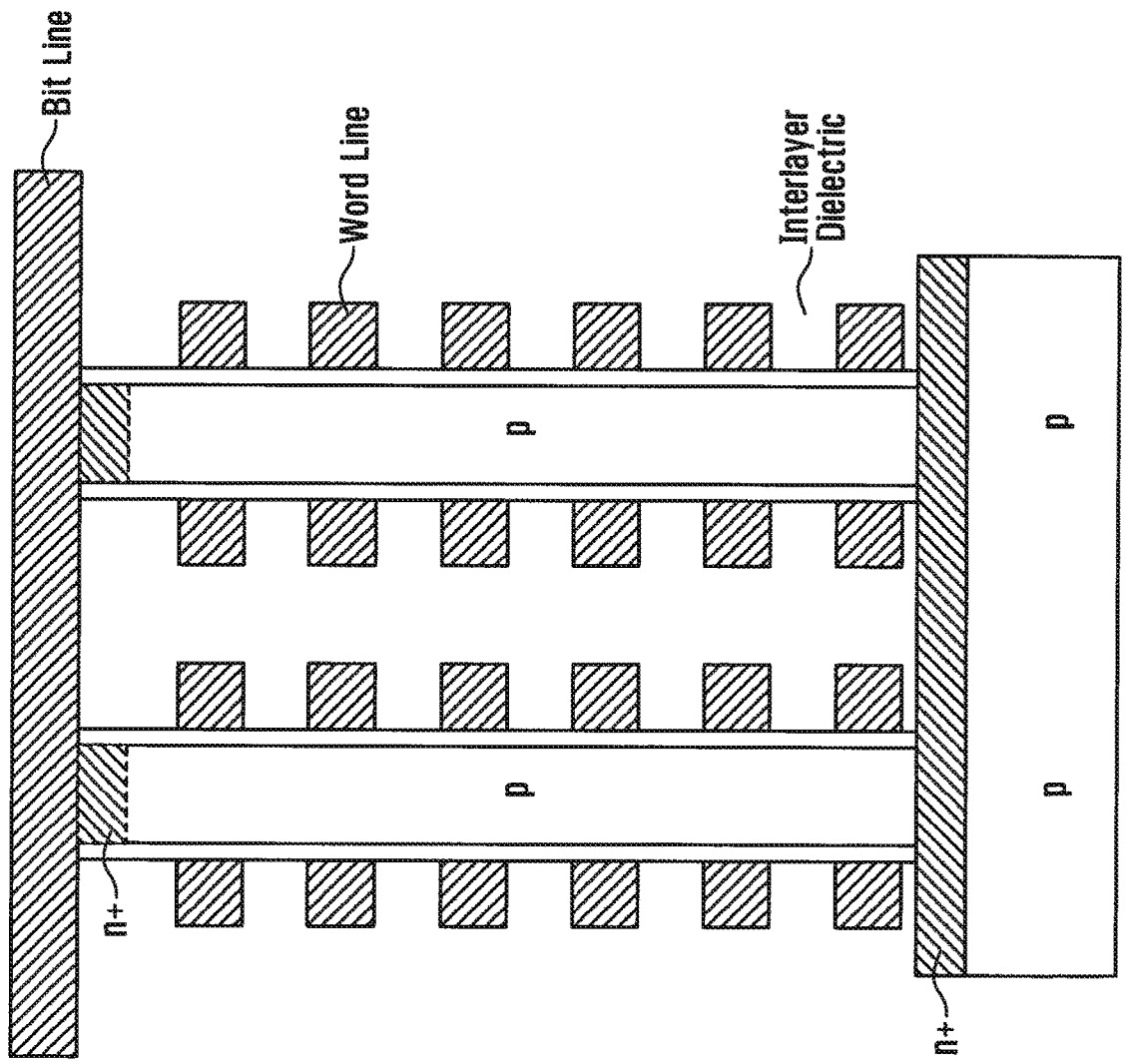
Figure 18:
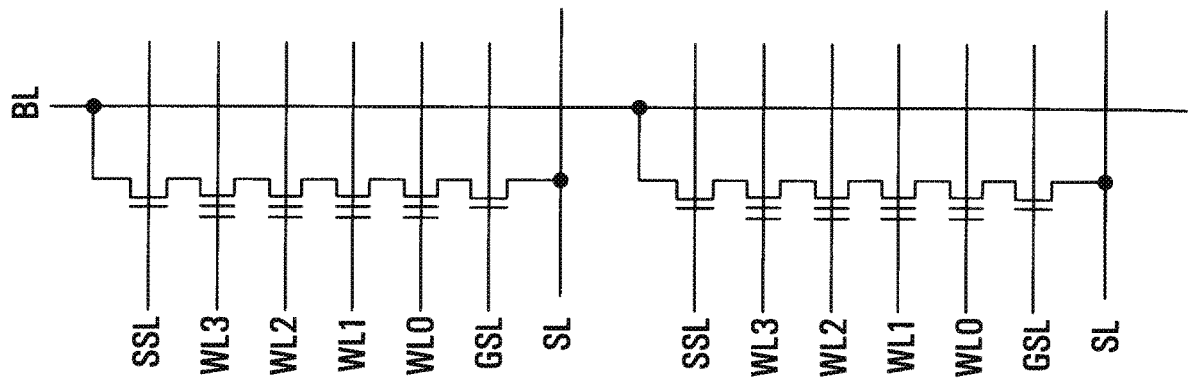
FIG. 18 illustrates vertical pillar NAND Flash strings with pillar bodies electrically connected to the cell array substrate.
Figure 18:
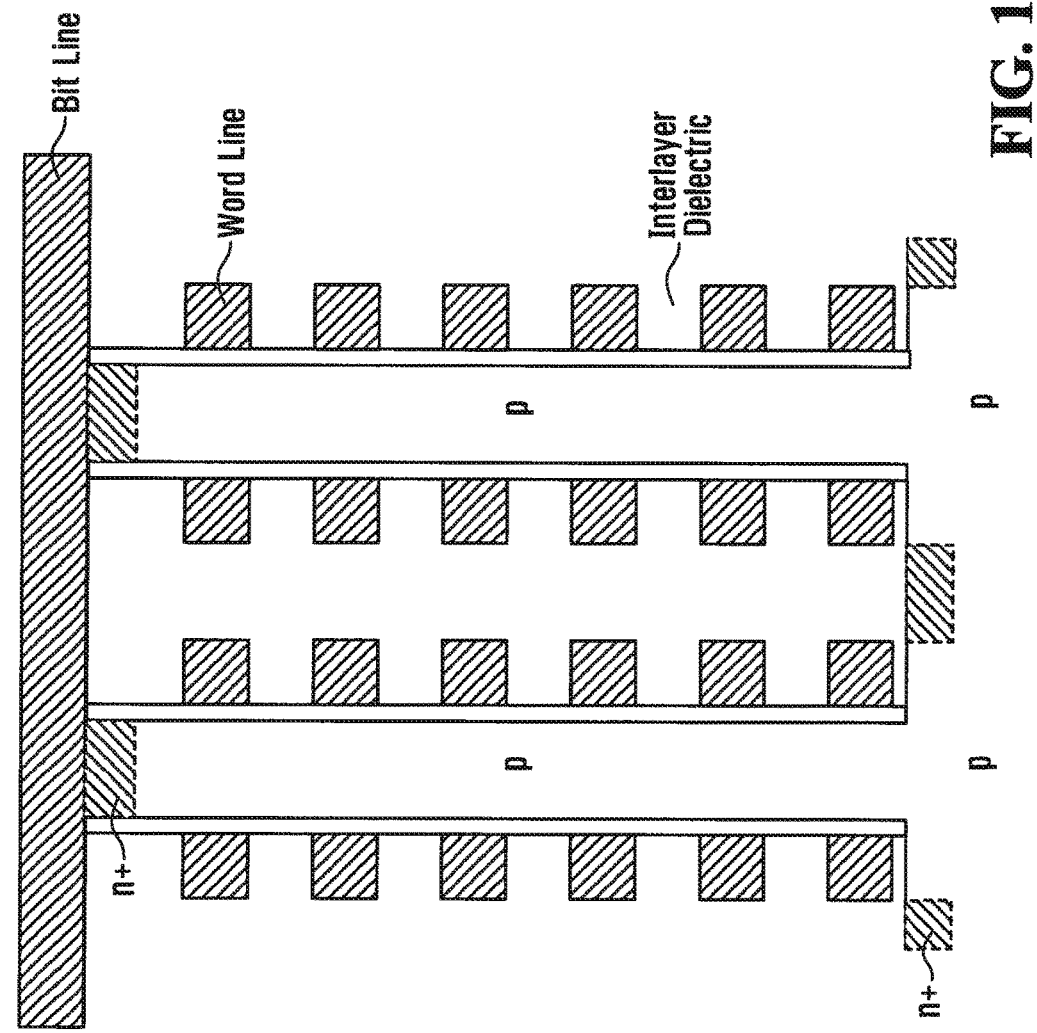

This embodiment deals with a specific type of NAND Flash transistor cells, where NAND cell strings are stacked in a direction which runs perpendicular to the chip surface. A vertical unit which comprises a cell string will be called "pillar" hereinafter. Examples of these kinds of NAND cells have been described in the following references:

H. Tanaka, "Bit Cost Scalable Technology with Punch and Plug Process for Ultra High Density Flash Memory", 2007 Symposium on VLSI Technology Digest of Technical Papers Jaehoon Jang et al. "Vertical Cell Array using TCAT (Terabit Cell Array Transistor) Technology for Ultra High Density NAND Flash Memory", 2009 Symposium on VLSI Technology Digest of Technical Papers Yoohyun Noh et al. "A New Metal Control Gate Last Process (MCGL process) for High Performance DC-SF (Dual Control gate with Surrounding Floating gate) 3D NAND Flash Memory", 2012 Symposium on VLSI Technology Digest of Technical Papers FIG. 17 and FIG. 18 show two different examples of such vertically aligned NAND cell strings. Although not a necessary requirement for this embodiment, in the most common embodiments the gates and the word lines wrap around the pillar bodies thus forming a gate-all-around structure. In the given examples as well as throughout the description it is assumed that NAND cell transistors consist of n-channel transistors on p-type substrate. However, N and p-type impurities may be interchanged so as to form p-channel transistors on n-type substrate.

Care has to be taken for the definition of the terms "body", "substrate" or "well", etc. to avoid any ambiguities. In planar NAND devices the bodies of the cells are identical to the overall underlying cell substrate as it consists of the same pocket p-well. In vertical devices this is not necessarily so. The bodies of the cell transistors are located within the individual pillars. These are spatially in locations different from the overall cell array substrate and may or may not be electrically connected with the cell array substrate. Therefore the bodies of the cell pillars may or may not be identical to the cell "body" or "substrate" that is formed by the underlying p-well. In the present description, whenever the body within a cell pillar is meant this will be named "pillar body". Whenever the substrate common to the entirety of the cell array is meant this will be designated by the term "cell substrate" or "cell array substrate". In addition, where an ion-implanted well of a substrate is referred to, this can be a pocket p-well, or it can be the entire substrate.

Two different kinds of cell structures exist for the described vertical cell structures. The first kind is shown in FIG. 17. The p-type pillar body is isolated from the p-type cell substrate by an n+ type diffusion layer which forms the source line of the cell strings. This type of vertical NAND device is not the subject of the proposed technique. The second kind is shown in FIG. 18, where the p-type pillar body is connected to the p-type cell substrate without any junction in between. The cell pillars thus have an opening at the bottom where the pillar body and cell array substrate, which are of the same impurity type, are electrically connected with each other.

The mechanism through which the bodies of the cell pillars are biased during erase operation is one aspect of the difference in the cell structure. In the first in FIG. 17 case where the p-substrate of the cell array is not in direct electrical connection with the pillar bodies, GIDL mechanisms have been proposed to charge the pillar bodies. This will not be described in detail here.

As another aspect of the difference in the cell structures the n-type and p-type regions at the bottom of the cell pillars take a different shape in the two cases, respectively. In the case where the pillar body is isolated from the cell substrate the bottom diffusion layer may be allowed to form a continuous n-type region if viewed from above without p-type regions. In this case the n-type region may extend in both directions, the bit line and the word line direction. This is indicated in the schematic on the right side of FIG. 17 by the line connection between adjacent source lines.

In the case where the pillar body is not isolated from the cell substrate certain restrictions apply to the exact shape of the n-type region, as there always have to exist regions under the cell pillars which are not n-type to ensure the p-type pillar bodies are electrically connected to the p-type cell substrate, but the n-type channels of the pillar transistors are connected to the n-type regions of the substrate. Those restrictions may result in difficulties connecting source lines arbitrary directions.

The proposed technique applies to the second of the mentioned cases where p-type pillar bodies are connected to the p-type substrate of the cell array without any junction in-between.

The application provides a method of manufacturing vertically stacked NAND Flash memory cells of a type as described in FIG. 18 with a diffused n+ source line where the cell body is of the same impurity type as and electrically connected to the chip substrate and not separated by a pn junction, and corresponding devices. The proposed manufacturing scheme improves weak points present with prior manufacturing schemes.

A first weak point to be improved is present with some prior manufacturing schemes described in the next section. The problem is known as source line bounce which is caused by high cell currents and high source line resistances. It is of foremost importance that the source line maintains the voltage applied to it during read or write operations throughout the entirety of the cell array. There are, however, practical obstacles to it.

As the source line consists of diffusion layers in some common vertical NAND Flash devices the sheet resistance may be up to several ohms/square, which can add up through the entire length of the source line to a resistance of several hundred kiloohms and more, even if a silicidation process is applied to reduce the resistance.

Figure 19:
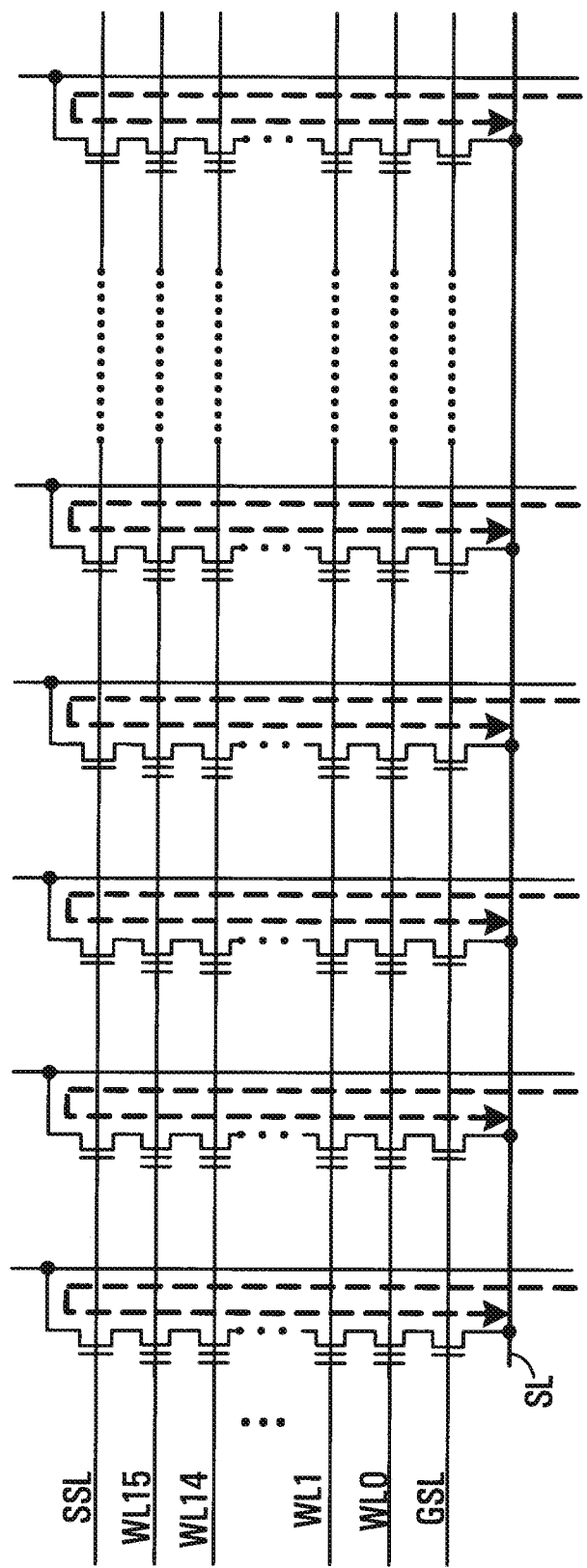
FIG. 19 illustrates cell current flowing in entire page to a single source line.

If the resistance of the source lines is high it is disadvantageous if all cells of the same page are connected to the same source line. See for example FIG. 19 where the source lines run in the same direction as the word lines. In a read operation a cell current flows through all cell strings which are part of a selected block, e.g. 64K cells for 8 KB sized pages. Assuming a sheet resistance of a few ohms/square for the silicided diffusion layer and cell currents around 100 nanoampere, the source line bounce can add up to be in the volt range in the middle of the source line if no other measures are taken.

Thus it seems not desirable that the source lines run in the word line direction as all the currents of cells belonging to the same page will crowd on the same source line. However, the source line running in a direction parallel to the word line is a natural outcome of some prior manufacturing schemes.

A second weak point is present with some other manufacturing schemes described in the next section. It is related to the fact that although the manufacturing process may be aimed at forming a structure such that the pillar body is open at the bottom and connected to the p-type substrate of the chip, in some specific cell structure n-type dopant diffusion from the source line may isolate the open path between the cell pillar body and the chip substrate (see example 2 in the next section).

Figure 20:
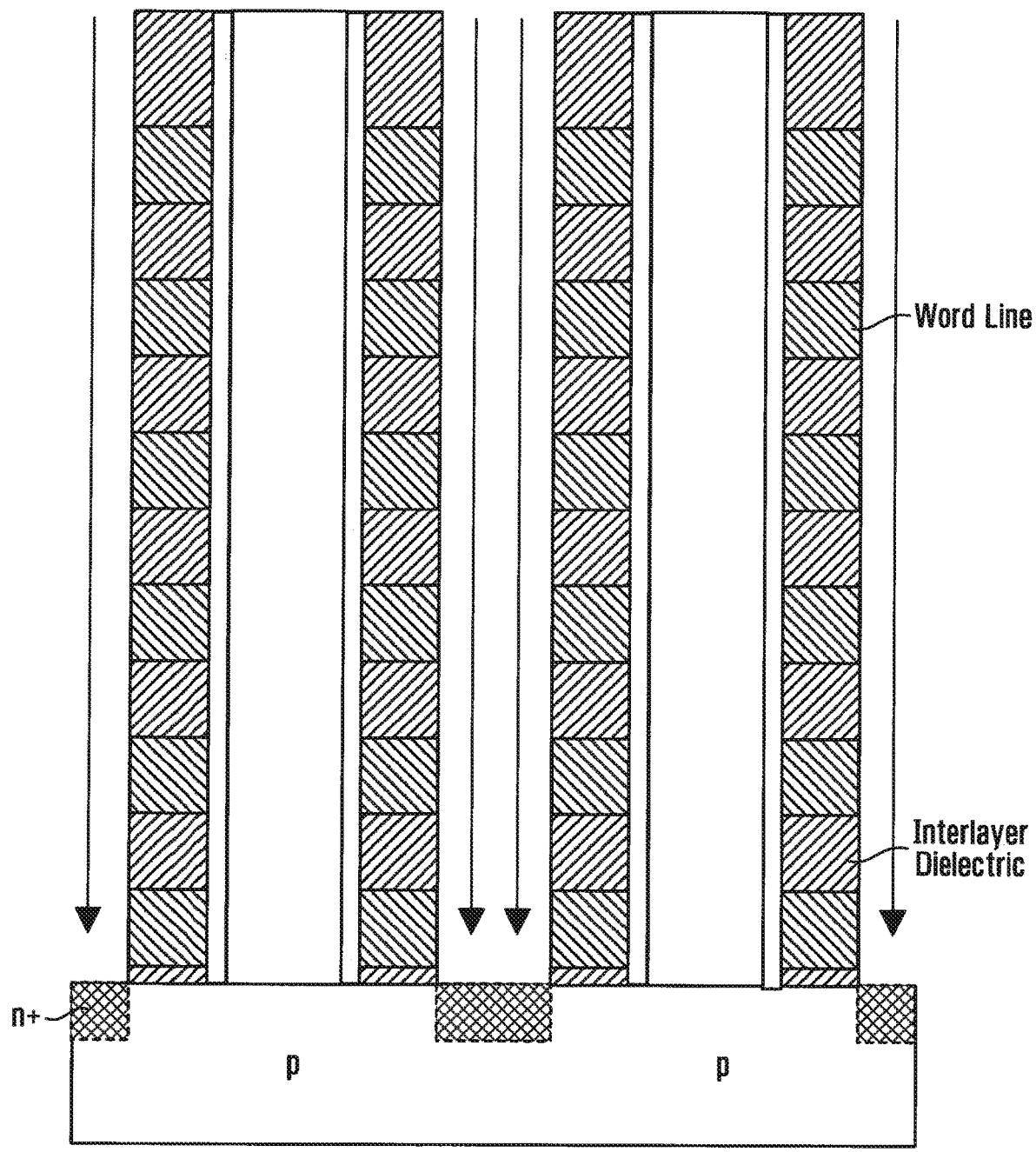
FIG. 20 illustrates a source line manufacturing step.

An existing method of forming diffused source lines is shown FIG. 20. This is the underlying method for forming vertical NAND Flash cells as described in U.S. Pat. No. 8,203,211 B2, U.S. Pat. No. 8,278,170 B2.

The source line is formed by impurity implantation and diffusion after etching the word lines, using the word line patterns as a mask. It can be easily seen that the direction of the source lines in the word line direction follows naturally from the manufacturing method.

To reduce the source line resistance additional measures have been proposed as in "U.S. Pat. No. 8,203,211B2, Nonvolatile memory devices having a three dimensional structure", where strapping regions are introduced where the diffused source lines are connected by diffused dummy regions in the bit line direction. However, since these regions cannot be used as memory cells, this solution comes with an increase in cell array size.

Figure 21:
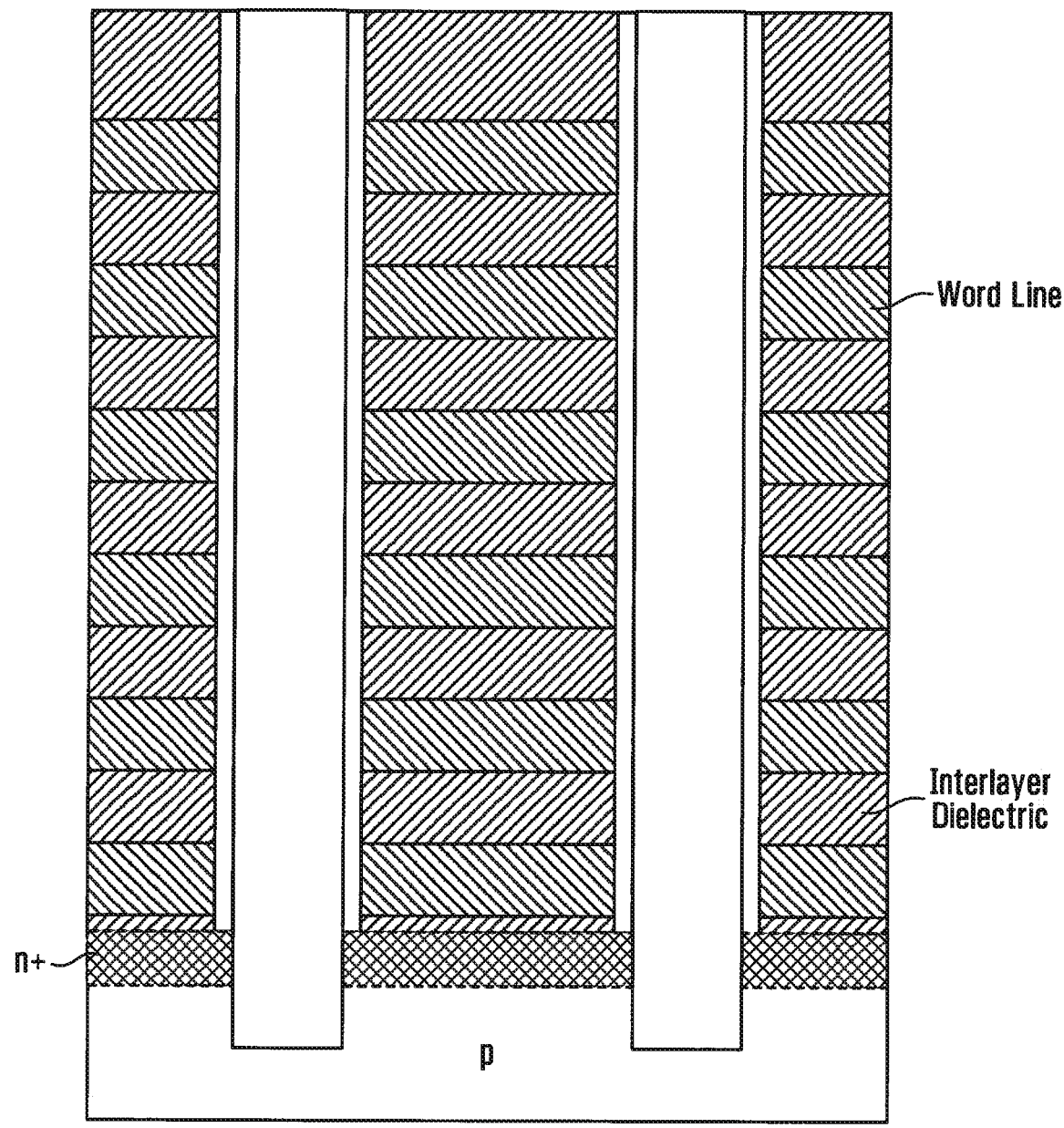
FIG. 21 illustrates an alternative source line manufacturing step.

In another scheme as in Y. Noh et al., "A New Metal Control Gate Last Process (MCGL process) for High Performance DC-SF (Dual Control gate with Surrounding Floating gate) 3D NAND Flash Memory", 2012 Symposium on VLSI Technology Digest of Technical Papers, p. 19-20, it is proposed that a blank substrate n+ diffusion layer is formed by blank ion implantation first. In a later step the pillar contact hole is etched through the blank n+ diffusion layer to establish an electrical contact between the cell pillar body and the substrate p-well (FIG. 21).

Figure 22:
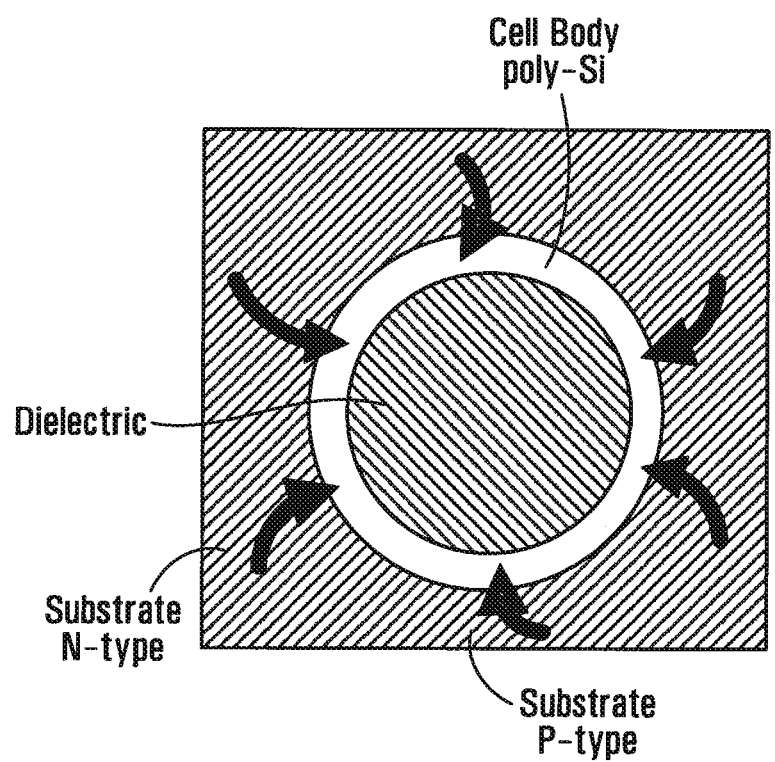
FIG. 22 illustrates dopant diffusion between the substrate and the cell body.

This scheme may be weak to n-type dopant diffusion from the n+ source to the cell pillar body, especially for some schemes where the cell pillar body does not consist of bulk poly-Si which fills the entire hole, but where the cell pillar body consists of a thin poly-Si film surrounding a dielectric contact filler. N-type dopant diffusion from the substrate n+ region may turn the impurity type of the tube type cell body at the bottom region into n-type as shown in FIG. 22, thereby disconnecting cell body from the substrate p-well.

The embodiments described hereinafter will show manufacturing methods and corresponding devices which:

1. have as a result that source line diffused regions are connected in a direction perpendicular to the word lines and parallel to the bit line direction;
2. bodies of cell pillars are electrically connected to the ion-implanted well and are of the same impurity type;
3. cell pillar patterns are aligned to the impurity regions forming the source lines; and
4. are robust to dopant diffusion of unwanted impurity type.

First Embodiment

In a first embodiment a manufacturing method is provided where a source line is formed first, cell stacking layers are formed thereafter and the cell pillars are formed in alignment to the previously formed source lines. FIG. 23 to FIG. 33 show the step-by-step manufacturing process. It is understood that the shown manufacturing steps include only common semiconductor processes. The left of each Figure shows a top view of a region of a cell area, the middle of each Figure shows a vertical cut in a region of a cell area in the direction of the word lines, the right of each Figure shows a vertical cut in a region of a cell area in the direction of the bit lines.

In the first embodiment the source line itself is not only formed by diffusion but by patterning, (including etching) as well. The patterning step used to perform patterning in the cell area is also used to create a photo alignment mark in a photo alignment mark region, outside the cell area. Further details of the photo alignment mark are described below in the context of the second embodiment.

Figure 23:
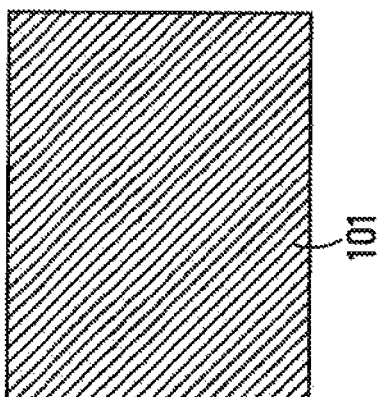
FIG. 23 illustrates a p-well implant manufacturing step.
Figure 23:
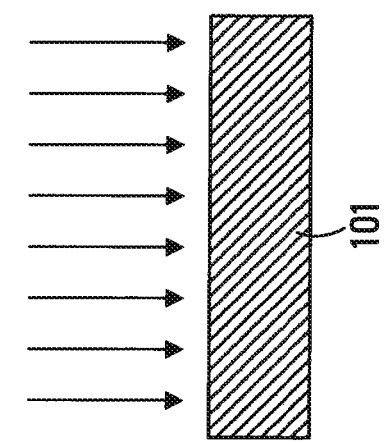
Figure 23:
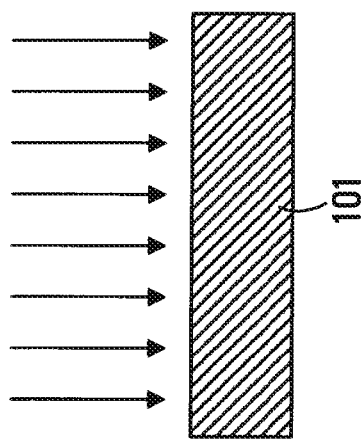

In the manufacturing step shown in FIG. 23 a p-well in the cell region is formed by ion implantation. The ion implanted p-well is indicated at 101. Although not shown the p-well in the cell region may be a pocket p-well which is separated from the p-well substrate of the chip periphery circuitry.

Figure 24:
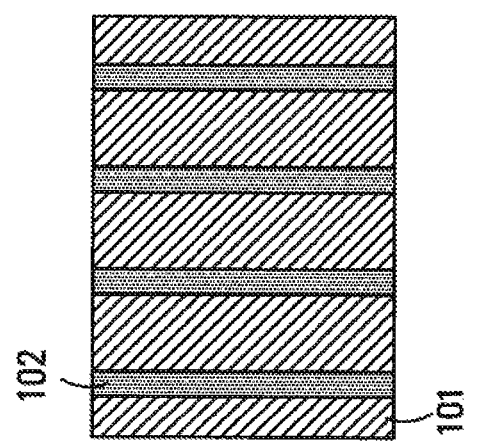
FIG. 24 illustrates an active/field patterning manufacturing step.
Figure 24:
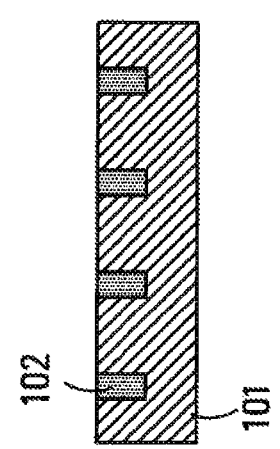
Figure 24:
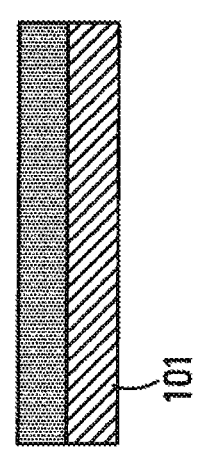

In the next step as shown in FIG. 24 stripe-shaped active/field regions are formed by a standard semiconductor manufacturing process, for example the so-called STI (shallow trench isolation) process. The trenches run in the direction of the bit lines. Hereby stripe-shaped trenches (fields) are formed and filled with a dielectric material 102, for example silicon oxide. In some embodiments this Active/field patterning process is performed at the same time as the Active/field patterning of the rest of the chip circuitry such that no separate process exists for the cell area.

Figure 25:
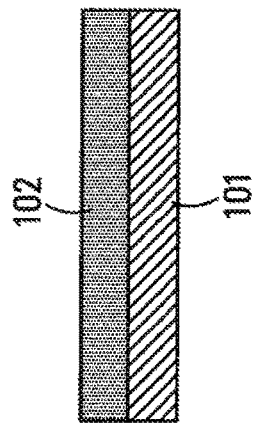
FIG. 25 illustrates a source line formation manufacturing step (embodiment)
Figure 25:
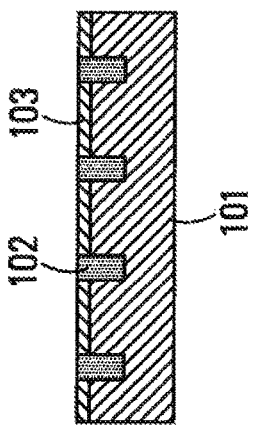
Figure 25:
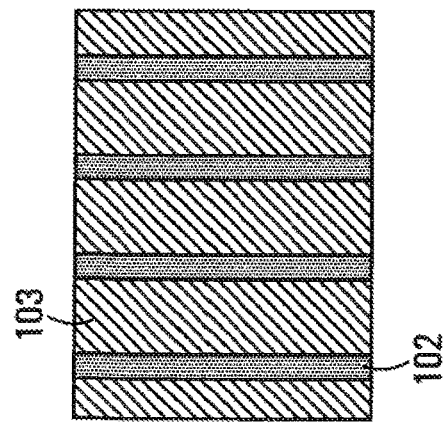

In the next step as shown in FIG. 25 ion implantation and annealing are performed to form n-type conductive regions 103 in the active regions, but not in the non-conducting field regions 102. In some embodiments this source/drain formation process is performed at the same time as the source/drain formation process of the rest of the chip circuitry such that no separate process exists for the cell area. In some embodiments the order of the steps in FIG. 24 and FIG. 25 may be interchanged such that the n+ diffusion process is performed first and the active/field patterning process thereafter.

Figure 26:
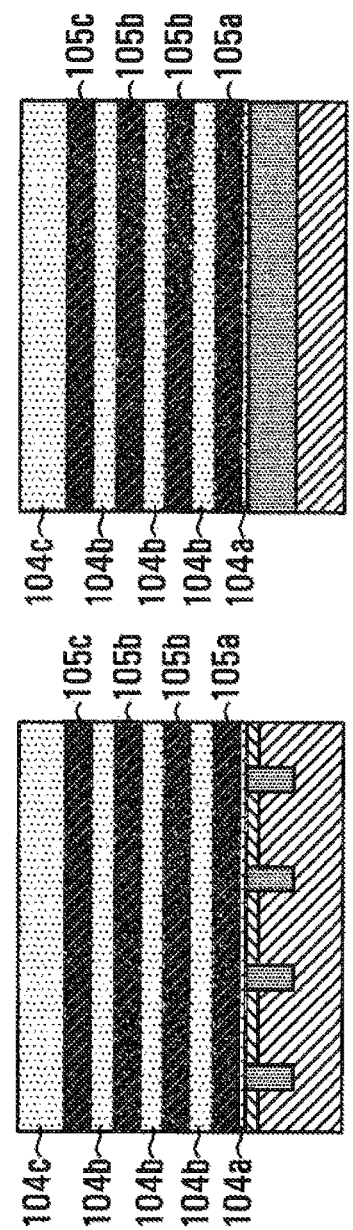
FIG. 26 illustrates a cell stack deposition manufacturing step.
Figure 26:
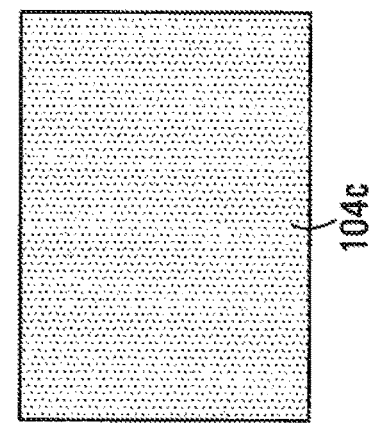

In the next step as shown in FIG. 26 alternating non-conductive dielectric layers 104a-104c and conducting layers 105a-105c are deposited. From the conducting layers 105a-105c the gates of the cell transistors are formed in later steps. The non-conducting layers are interlayer dielectric layers between the cell transistor gates. The conducting layers may be for example n+ or p+ doped poly-Si. The lowest non-conducting layers 104a may be of lower thickness (for example around 10 nm) than the intermediate non-conducting layers 104b, which may be around 20 nm thick. The lowest non-conducting layer 104a may be of a different material, for example undoped silicon oxide, from the intermediate non-conducting layers 104b, which may be for example doped silicon oxide. In some embodiments the lowest non-conducting layer 104a may be formed through an oxidization process of the silicon substrate and not through a layer deposition process. The top non-conducting layer 104c may be of a higher thickness, for example 40 nm, than the intermediate non-conducting layers 104b. The highest non-conducting layer 104c may be of a different material, for example silicon nitride, from the intermediate non-conducting layers 104b. Although only 4 conductive layers are shown it is understood that as in most known NAND Flash devices, the number of layers corresponds to the numbers of transistors in NAND Flash strings which may be a number higher than 4, for example the number of intermediate conductive layers may be 64.

Figure 27:
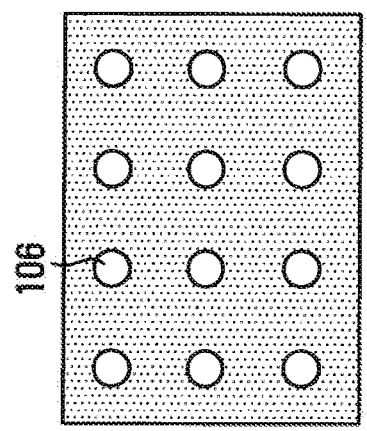
FIG. 27 illustrates a pillar hole formation manufacturing step.
Figure 27:
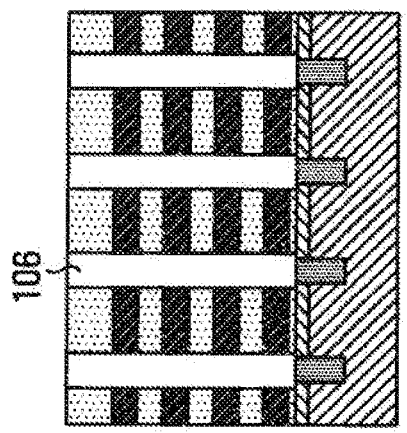
Figure 27:
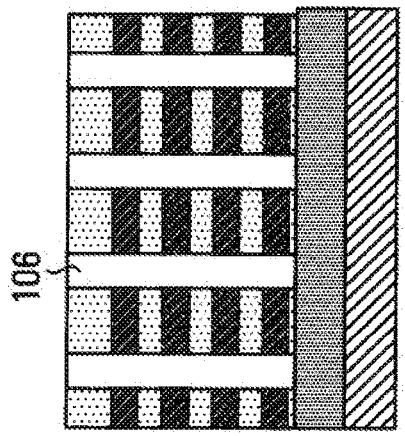

In the next step as shown in FIG. 27 holes 106 are etched in a first etching step such that pillar holes are formed in a regular row and column pattern and such that the holes are formed on regions where the stripe shaped field patterns 102 were formed in an earlier step. This is achieved by aligned this step to an alignment mark which was formed during the active/field patterning step. Furthermore the holes 106 are etched through the cell stack layers 104a-104c and 105a-105c but not through the field dielectric 102.

In the next step as shown in 28 the gate dielectric layers 107 are deposited. Although not shown it is understood that the gate dielectric layer 107 may for example be a multi-layer structure consisting of the tunnel dielectric, the charge trap layer and a coupling dielectric as in some common NAND Flash cells. The tunnel dielectric may be silicon oxide, the charge trap layer may be silicon nitride and the coupling dielectric may be silicon oxide. Although shown as a single step, the dielectric formation step may be multiple steps to form different dielectric layers at the lowest 105a, the intermediate 105b and the highest 105c regions.

In the next step in FIG. 29 a second etch step is performed which extends the existing pillar holes (106 of FIG. 27) through the field dielectric to produce holes 108 shown in FIG. 29 and thereby expose the underlying p-well substrate.

In some embodiments, the etch step of FIG. 29 is divided into two steps. These would include a first etch step removes the gate dielectric layer 7 except from the vertical inner sidewalls of the pillar holes. A second etch step then extends the existing pillar holes (106 of FIG. 27) through the field dielectric to produce holes 108 shown in FIG. 29 and exposes the underlying p-well substrate. The first and second etch step may be either separate or combined into one etch step.

In the next step in FIG. 30, a pillar body 109 is formed in each pillar hole. For the purpose of this example, it is assumed that the pillar body is p-doped silicon such that the pillar body and the p-type ion implanted well form a single node during an erase operation of the resulting NAND flash memory. They form a single node in the sense that if one is charged, the other is charged as well; there is no junction in between.

Figure 31:
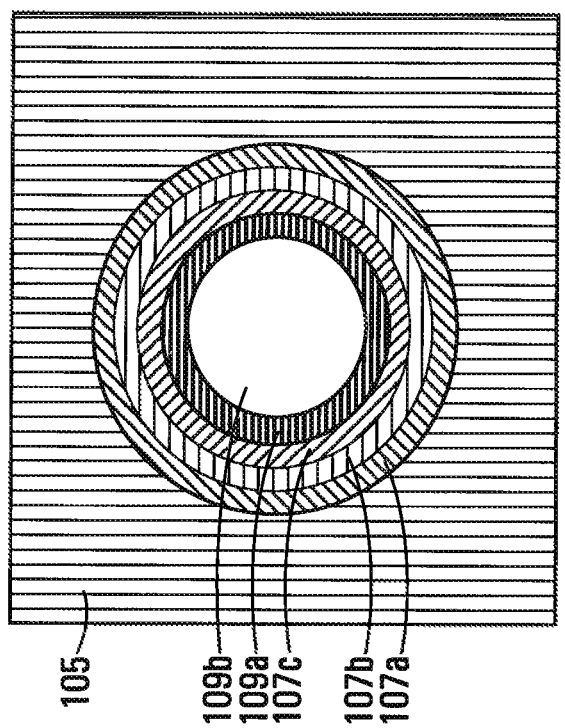
FIG. 31 illustrates cell pillar fill layer details

FIG. 31 shows an example of a cross section of a multilayer filled cell pillar employed in some embodiments. The pillar is surrounded by the gate material 105. The outermost layers comprise the gate dielectrics 107a-107c. Going in a direction from the outermost to the innermost layers, the filling layers consist of a tunnel dielectric 107a which may be silicon oxide, a charge trap layer 107b which may be silicon nitride, a coupling layer 107c which may be silicon oxide, the transistor body 109a which may be undoped poly silicon and a dielectric filler 109b which may be silicon oxide. In another embodiment there is no dielectric filler 109b, but the silicon body 109a fills all the remaining innermost part of the pillar.

In the next step as shown in FIG. 32 the word lines of all vertically stacked layers are etched at the same single photolithography mask step to form alternating fin patterns 110 and slit patterns 111.

In the next steps as shown in FIG. 33 the slits 111 of FIG. 32 are filled with an isolating dielectric such as for example silicon oxide as indicated at 112. In a subsequent step the topmost part of the cell pillars is doped such as to form an n+ diffusion layer 113 which is at the same time the drain of the NAND Cell pillar. In a subsequent step the bit lines 114 are formed with a standard metallization process such as to form electrical connections to the string drains 113.

Second Embodiment

FIG. 34 to FIG. 47 show a step-by-step manufacturing process in the second embodiment.

Figure 34:
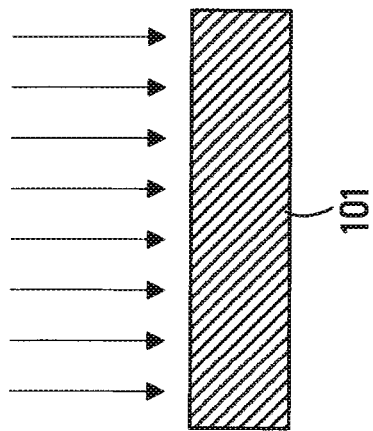
FIG. 34 illustrates a p-well implant manufacturing step.
Figure 34:
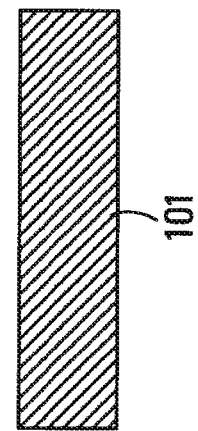
Figure 34:
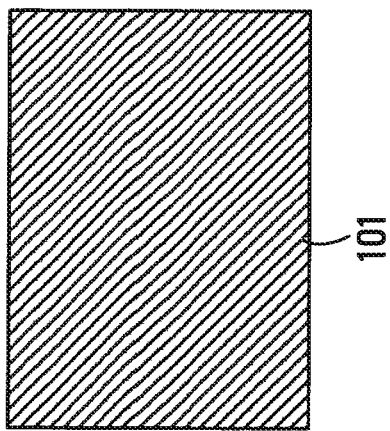
Figure 35:
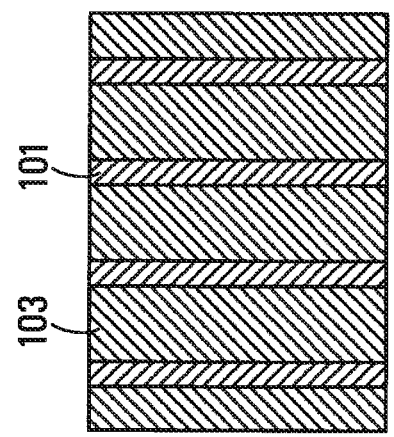
FIG. 35 illustrates a source line formation manufacturing step (embodiment)

The step in FIG. 34 is identical to the step in FIG. 23 in the first embodiment. Contrary to the first embodiment there is no active/field patterning process that includes etching in the cell region. In other words, the step of FIG. 24 is not performed.

In the next step as shown in 35 an n+ source implant process is performed at a photolithography mask step such as to form a stripe-shaped diffusion layer 300 of n-type and a stripe-shaped 301 diffusion layer of p-type. Contrary to the first embodiment no patterning of the active substrate through etching takes place.

In the second embodiment this step comprises a photolithography mask step used to define the n-type source lines that at the same time defines a location of a photo alignment mark through patterning, including etching, outside the cell area. The formation of the stripe-shaped diffusion layer 300 and the alignment mark will be described separately later.

Figure 36:
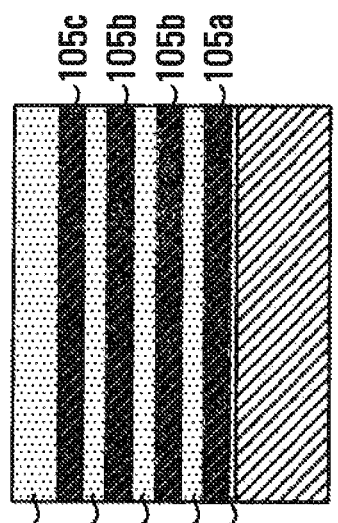
FIG. 36 illustrates a cell stack deposition manufacturing step.
Figure 36:
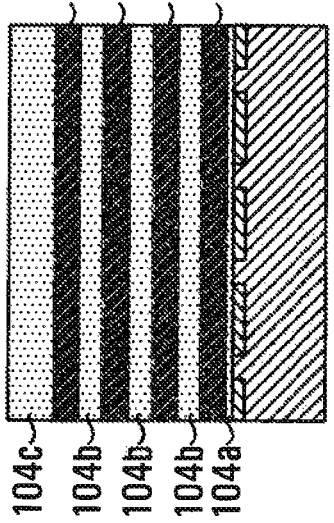
Figure 36:
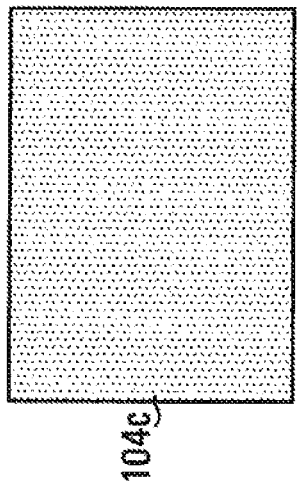

The next step in FIG. 36 is identical to the step in FIG. 26 in the first embodiment.

Figure 37:
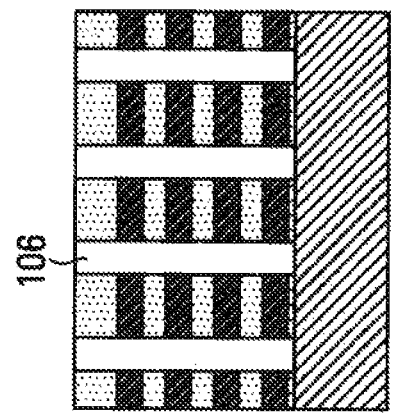
FIG. 37 illustrates a pillar hole formation manufacturing step.
Figure 37:
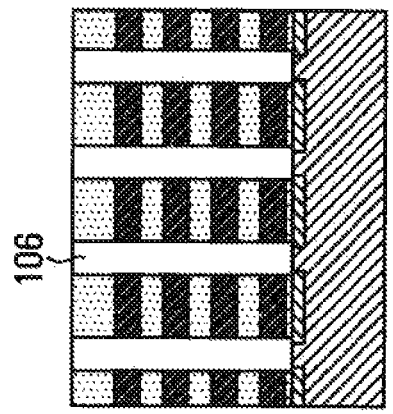
Figure 37:
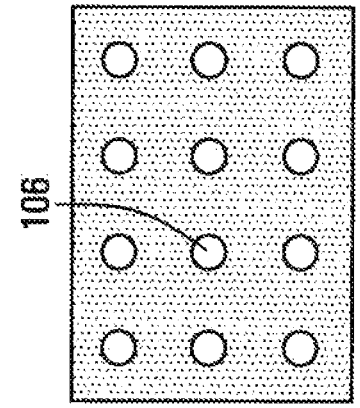

The next step in FIG. 37 is identical to the step in FIG. 27 in the first embodiment. As in the first embodiment the cell pillar holes 106 are aligned to the substrate n+ diffusion regions in a way that the holes are formed on regions which are of p-type diffusion. However, contrary to the first embodiment there do not exist any active/field patterns in the cell region. The alignment of this photolithography mask step is performed using an alignment mark, the formation of which is described later.

Figure 28:
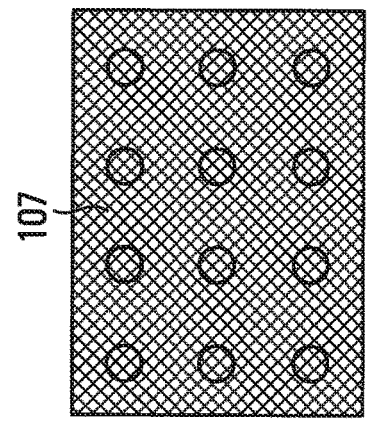
FIG. 28 illustrates a cell gate dielectric deposition manufacturing step.
Figure 28:
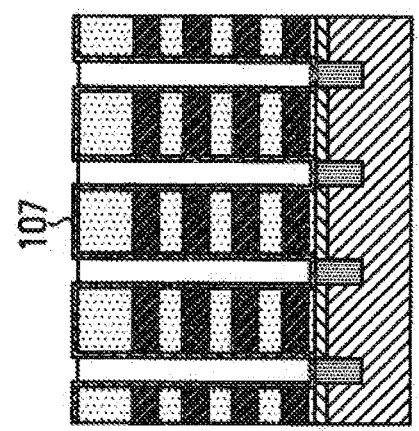
Figure 28:
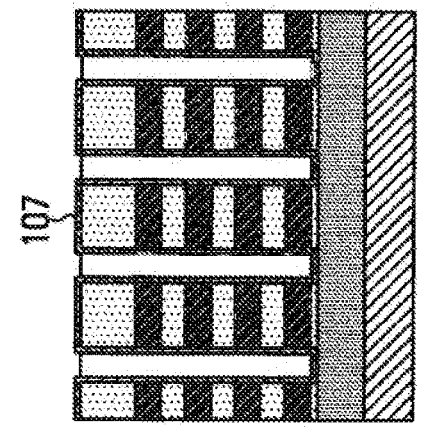

The step in FIG. 38 is identical to the step in FIG. 28 in the first embodiment.

The step in FIG. 39 is identical to the step in FIG. 29 in the first embodiment. However, contrary to the first embodiment the second etch step does not extend the pillar hole through a field dielectric layer but through to the substrate silicon. In some embodiments, the pillar holes are extended a defined distance into the substrate silicon.

Figure 42:
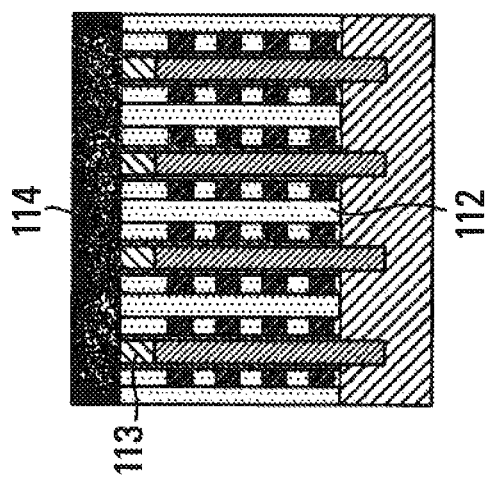
FIG. 42 illustrates a string drain n+ implant step and bit line formation manufacturing step.
Figure 42:
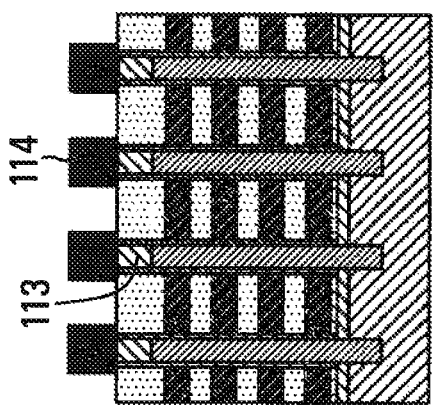
Figure 42:
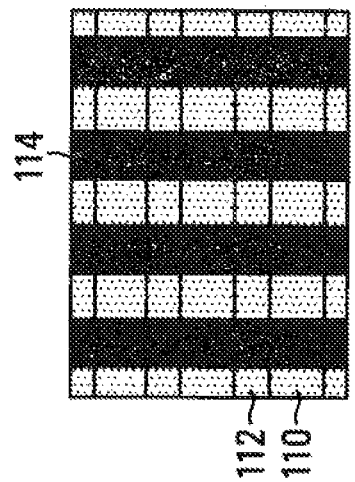

The remaining steps in FIG. 40 to FIG. 42 are identical to the steps in FIG. 30 to FIG. 33 in the first embodiment.

Figure 43:
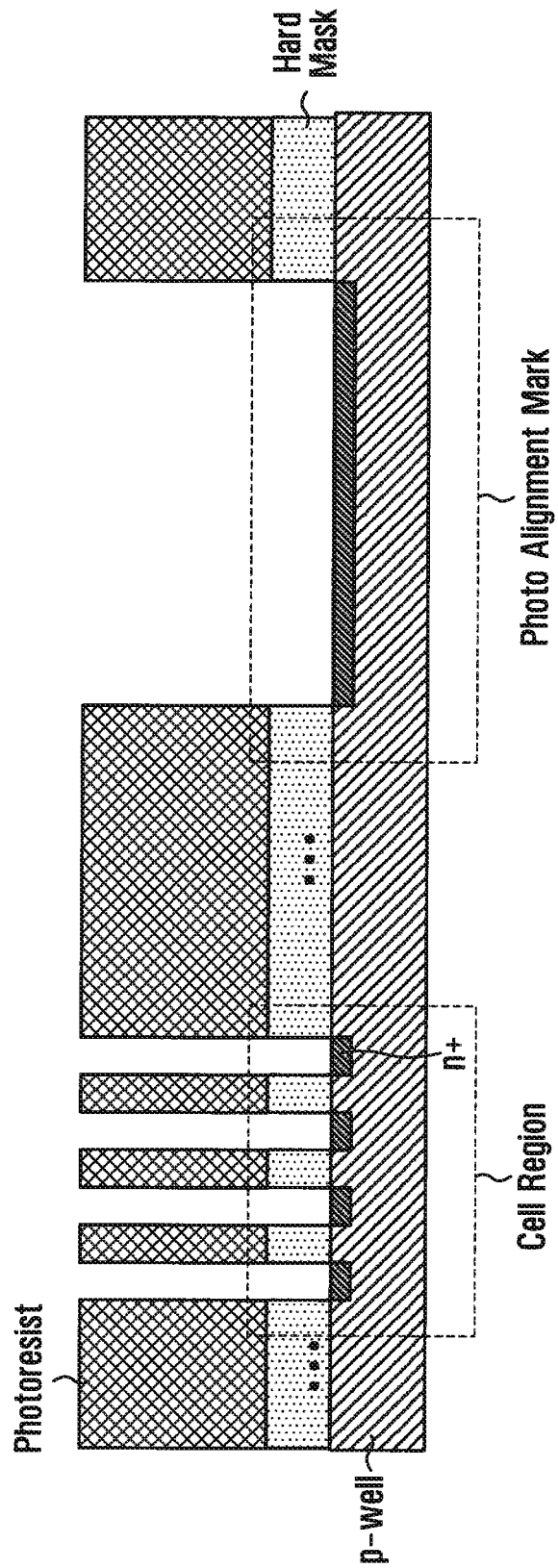
FIG. 43 illustrates an example of a photolithography mask step to define source lines and location of alignment mark.

A method is provided to align the pillar patterns to the underlying n and p-type diffusion regions. In this embodiment, etched photolithography alignment marks are formed. This is shown in FIG. 43 to FIG. 47. A first photolithography mask step is shown in FIG. 43. A hard mask material which has a different etch selectivity from the substrate silicon is deposited. The material may be for example silicon oxide. In FIG. 43, a photoresist is applied and then the hard mask is etched at the cell region and at the alignment mark region such as to expose the substrate silicon at the regions which are to be doped with the n+ type ion implantation to define the location of the source lines and the alignment mark. Subsequently, ion implantation to form the bottom source line is performed at the cell region and at the alignment mark region alike.

Figure 44:
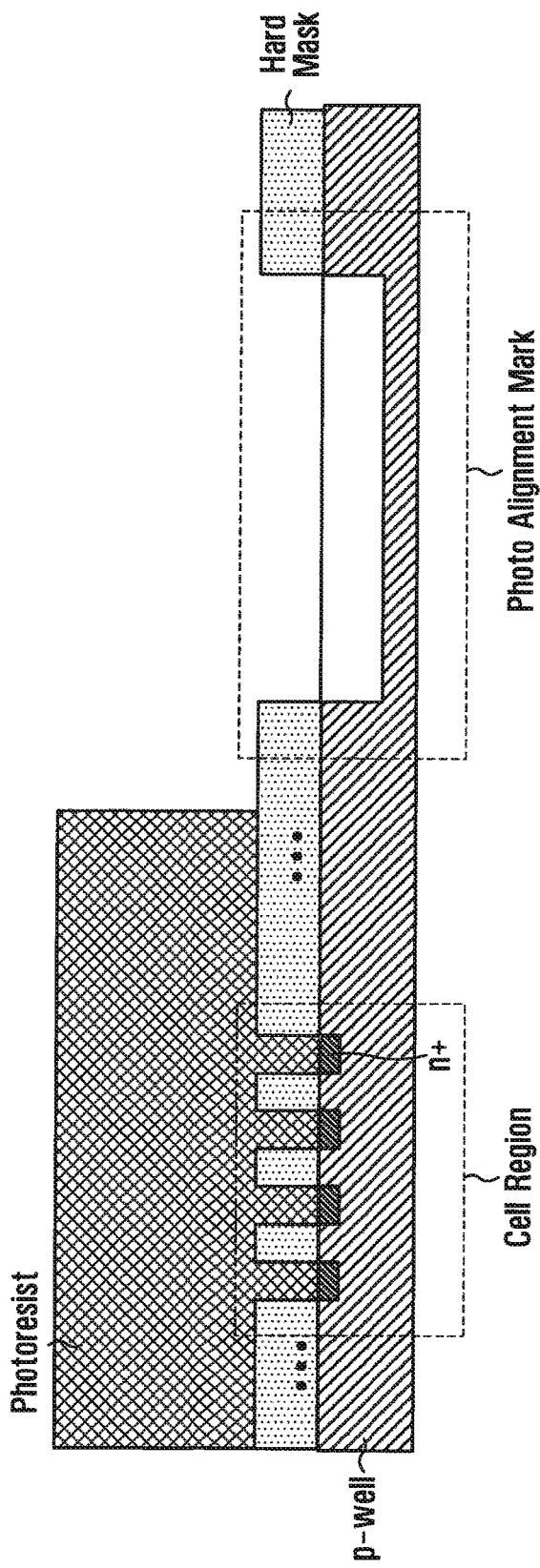
FIG. 44 illustrates a further photolithography mask step to finish the alignment mark.

FIG. 44 shows a subsequent photolithography mask step where an etched pattern is formed in the substrate at the alignment mark but not in the cell area.

Figure 45:
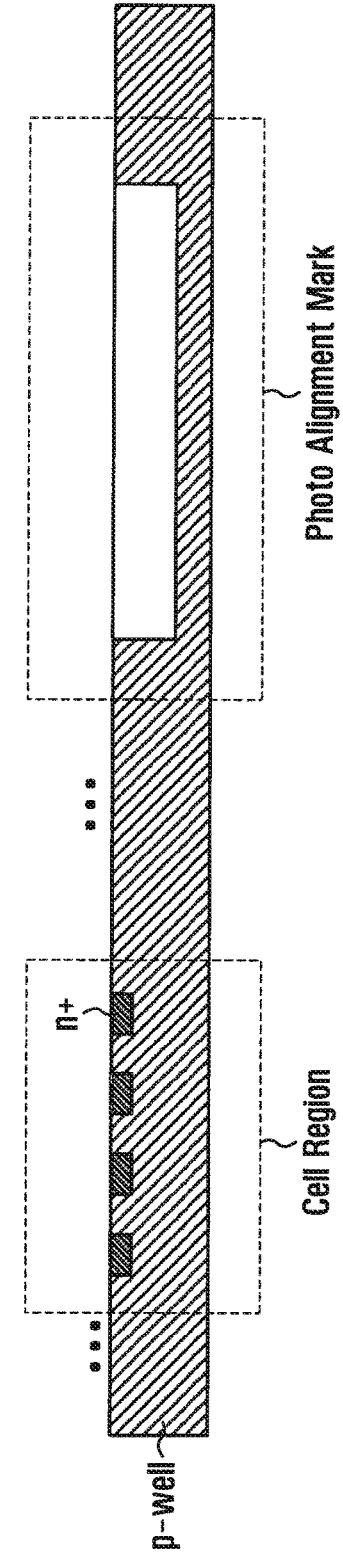
FIG. 45 illustrates a hard mask strip step.

At the next step as shown in FIG. 45 the hard mask material is stripped by a selective etch process.

Figure 46:
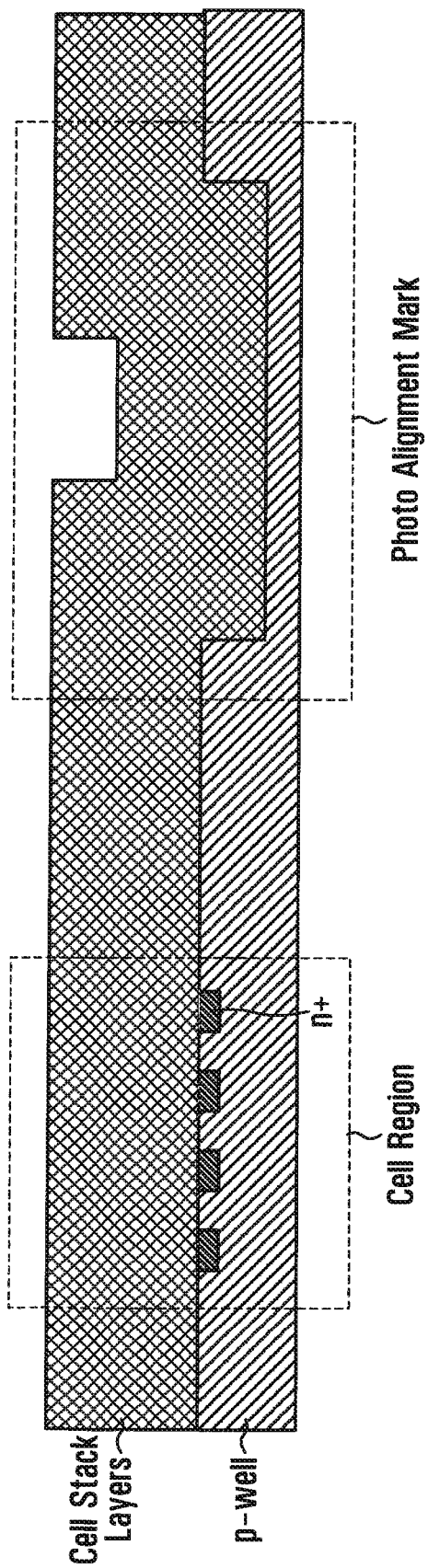
FIG. 46 illustrates a cell stack deposition step.
Figure 47:
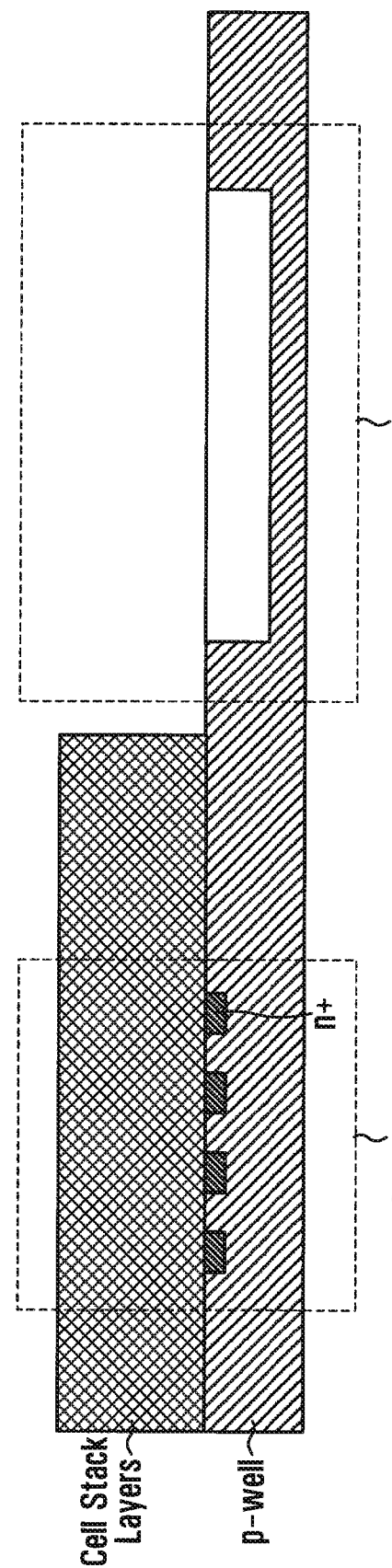
FIG. 47 illustrates an alignment mark open step.

In subsequent steps as shown in FIG. 46 and FIG. 47 which are identical to the cell formation steps described before the cell stack layers (104a-104c, 105a-105c in the previous descriptions) are deposited on top of the diffused cell regions and the alignment marks.

There are two different ways this photo alignment mark can be utilized for the alignment in the subsequent cell pillar patterning process. In the first method simply the height difference of the alignment mark can be directly used. In the second method an alignment mark open step can be performed as depicted in FIG. 47 to remove the cell stack layers only from the photo alignment mark region and thus to enhance the visibility of the alignment mark.

In both embodiments described so far, the source line patterns consisting of impurity implanted (and diffused) regions are formed before the stacking and patterning of the cell stack layers takes place. This gives the freedom to align the source line patterns so as to run in a direction perpendicular to the word lines.

Figure 48:
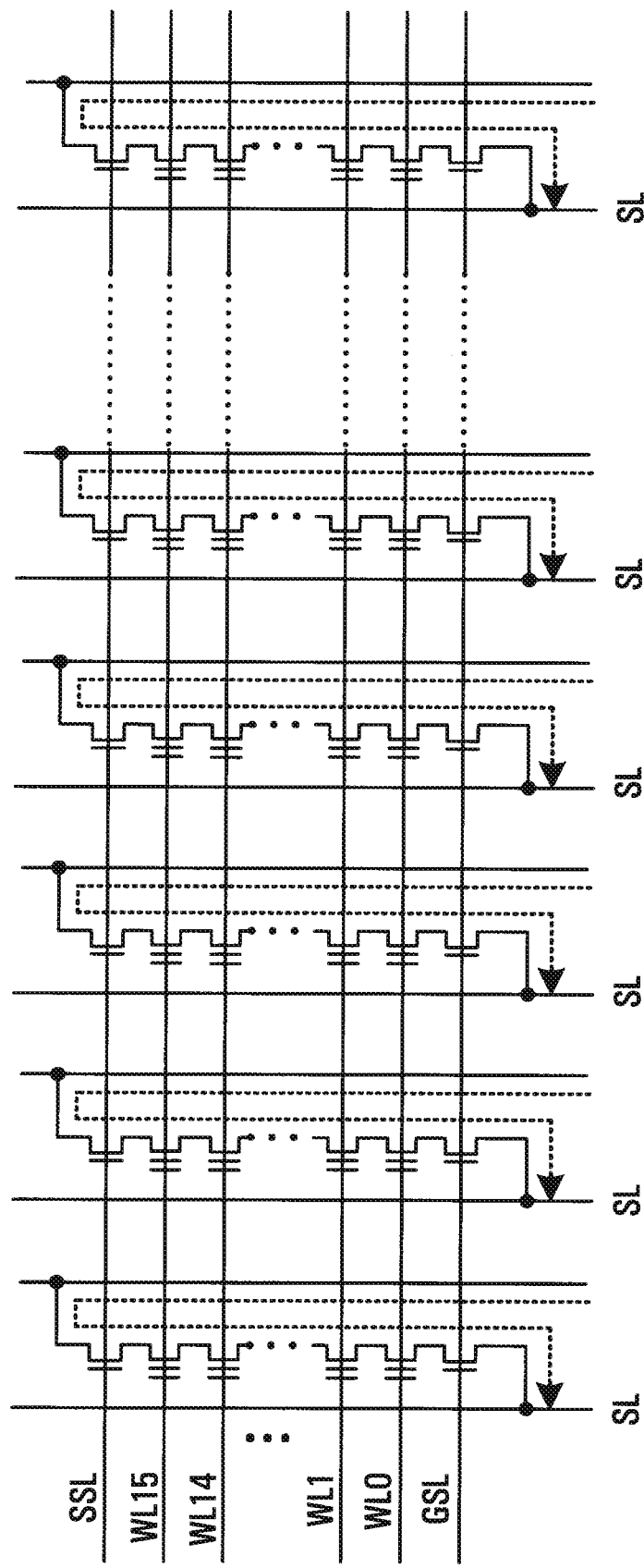
FIG. 48 illustrates cell current flowing in entire page to separate source lines.

The advantage of connecting source lines in the bit line direction instead of in the word line direction can be seen in FIG. 48. This way the cell current of each cell string flows into separate source lines and thus source line bouncing is reduced.

In both embodiments, the location of the photolithography alignment mark is defined at the same photolithography mask step as the source line formation. This way it is ensured that alignment of cell pillar patterns relative to the source line patterns can take place in a later step.

Figure 49:
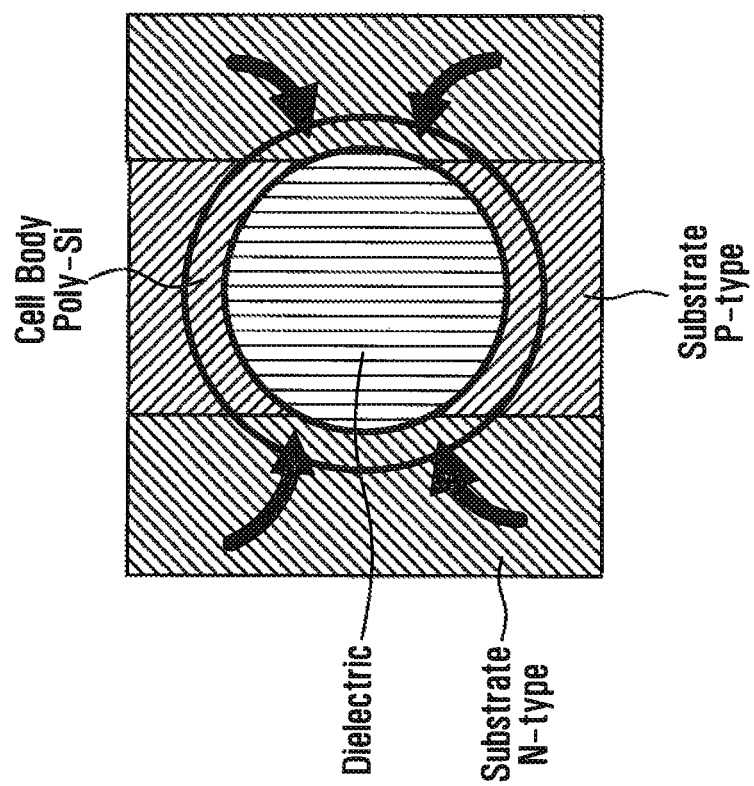
FIG. 49 illustrates dopant diffusion from the n-type source line to the cell body in case of tube-shaped cell bodies.

As another advantage, the proposed scheme with stripe-shaped impurity regions may be more robust than the scheme in Y. Noh et al., "A New Metal Control Gate Last Process (MCGL process) for High Performance DC-SF (Dual Control gate with Surrounding Floating gate) 3D NAND Flash Memory", 2012 Symposium on VLSI Technology Digest of Technical Papers, p. 19-20, where the bottom source part of the cell pillar is surrounded by an n-type impurity region (see FIG. 49).

Other Examples

Although the given examples throughout the description are shown with the assumption that NAND cell transistors consist of n-channel transistors on p-type substrate and source lines consisting of n-type regions, the proposed technique is not restricted to this case. The polarity of the impurity types may be exchanged. N and p-type impurity regions may be interchanged so as to form p-channel transistors on n-type substrate and p-type source lines.

Although not mentioned explicitly, subsequent silicidation of the n-type diffusion layer or any other process to reduce the sheet resistance of the source line layer may be used.

The conductive layers 105a-105c which form the gate and word line material may be some metal such as tungsten instead of doped poly-Si.

Although the second embodiment is described in a way that the etching of the hard mask occurs before the impurity implant steps, it is equally possible to first perform the impurity implant steps through the hard mask material using the photoresist mask and afterwards to etch the hard mask to pattern the alignment marks, as long as source line impurity implant and the location of the alignment mark is defined in the same photolithography mask step.

Although the descriptions of the embodiments suggest that source lines run in one direction (the bit line direction) only, n-type source line strapping regions may be additionally interconnected in the word line direction. Although for the effectiveness of the proposed technique it is sufficient that the source lines patterns being connected in a direction perpendicular to the word lines, additional strapping regions which provide additional connections between regions of the same impurity type are also possible in connection with the present disclosure. In other embodiments the source lines are not necessarily parallel to the bit lines.

Although the proposed technique does not rely on any subsequent impurity implant after the formation of the cell stack, additional impurity implant at later steps is not excluded.

In the embodiments described herein, it is for the most part assumed that the pillar body is p-type silicon and the ion-implanted well is p-type silicon. More generally, in any of the embodiments described herein, the pillar body may instead be intrinsic (undoped) silicon or be lightly n-doped silicon, if in any of these cases it is still true that during an erase operation, the pillar body and the p-type ion-implanted well form a single node, with no junction in between.

Although the embodiments of the present disclosure have been described using the example of n-channel transistors on bodies of p-type conductivity, the present disclosure also applies for examples where all conductivity types are reversed so as to form p-channel transistors on bodies of n-type conductivity.

In some embodiments, the pillar hole is filled with a multi-layer structure consisting of that material that will form the connection to the ion-implanted well and a dielectric filler like silicon oxide which fills the innermost part of the hole.

The description contains numerous references to a photolithography mask step. A photolithography mask step can be viewed as the sum of all semiconductor chip manufacturing steps which are used to create one photoresist pattern, wherein as a result of this photoresist pattern, the photoresist covers some lateral regions in the chip but not other, AND the sum of all semiconductor chip manufacturing steps (e.g. etching, ion implant) which are applied on some lateral regions but not on other lateral regions in the chip, whereby the distinction between these different lateral regions is done using the same photoresist pattern for all these manufacturing steps, and whereby this photoresist pattern was created exactly once using a photolithography mask.

For example if a photoresist pattern is created using a photolithography mask, and a first manufacturing step is performed using this photoresist pattern and a second manufacturing step is performed using the same photoresist pattern (without removing and recreating the photoresist pattern in between the two manufacturing steps), it is said that the first manufacturing step and the second manufacturing step occur at the same photolithography mask step.

On the other hand, for example if a first photoresist pattern is created using a photolithography mask, and a first manufacturing step is performed using the first photoresist pattern, the first photoresist pattern is removed, a second photoresist pattern is created using a different or the same photolithography mask, a second manufacturing step is performed using the second photoresist pattern, it is said that the first and the second manufacturing steps do not occur at the same photolithography mask step.

It is noted that a photolithography mask is a device which is used (and reused) within a photolithography tool, whenever a certain kind of photoresist pattern needs to be created. It is not to be confused with photoresist masks (or patterns) or hard masks, which are patterns on the wafer.

In the embodiments described above, the device elements and circuits are connected to each other as shown in the figures for the sake of simplicity. In practical applications these devices, elements circuits, etc., may be connected directly to each other or indirectly through other devices elements, circuits, etc. Thus, in an actual configuration, the elements, circuits and devices are coupled either directly or indirectly with each other.

The above-described embodiments of the present disclosure are intended to be examples only. Alterations, modifications and variations may be effected to the particular embodiments by those of skill in the art without departing from the scope of the present disclosure, which is defined solely by the claims appended hereto.

What is claimed is:

1. A method for manufacturing a NAND flash memory device with a vertical cell stack structure, the method comprising:
   photolithographically defining, at a semiconductor surface, a first source line region, a second source line region, and a photo alignment mark, wherein the first source line region and the second source line region are separated from each other at the semiconductor surface;
   then depositing alternating first and second cell stack layers over at least the first source line region and the second source line region;
   etching a plurality of pillar holes through the alternating first and second cell stack layers at locations defined in alignment with the photo alignment mark;
   filling each pillar hole with at least a semiconductor material and a dielectric filler; and
   etching a plurality of slits through the alternating first and second cell stack layers.

2. The method of claim 1, wherein the defining step comprises:
   forming an n-type conductive layer at the semiconductor surface;
   then, using a photolithographically patterned mask, etching at least one trench into the semiconductor surface, one of the at least one trench separating the first source line region and the second source line region from each other; and
   filling the at least one trench with a dielectric material.

3. The method of claim 2, wherein each of the plurality of pillar holes extends deeper from the semiconductor surface than a depth of the n-type conductive layer.

4. The method of claim 1, wherein the defining step comprises:
   depositing a hard mask layer over the semiconductor surface;
   using a photolithographically patterned mask, etching portions of the hard mask layer to define locations of the first and second source lines and the photo alignment mark;
   ion implanting locations of the semiconductor surface exposed by the etched hard mask layer with an n-type dopant;
   applying a masking layer over the hard mask layer at the locations of first and second source line regions to expose the location of the photo alignment mark;
   then etching into the semiconductor surface at the location of the photo alignment mark; and
   removing the hard mask layer.

5. The method of claim 1, wherein the location of at least one of the plurality of pillar holes is between the first and second source line regions.

6. The method of claim 1, wherein the defining step comprises:
   using a photolithographically patterned mask, etching at least one trench into the semiconductor surface;
   filling the at least one trench with a dielectric material; and
   then forming an n-type conductive layer at the semiconductor surface on opposite sides of at least one trench to define the first source line region and the second source line region.

7. The method of claim 6, wherein each of the plurality of pillar holes extends deeper from the semiconductor surface than a depth of the n-type conductive layer.

* * * * *